(12) United States Patent
Nikipelov et al.

(10) Patent No.: US 9,952,513 B2
(45) Date of Patent: Apr. 24, 2018

(54) UNDULATOR

(71) Applicant: ASML Netherlands B.V., Veldhoven (NL)

(72) Inventors: Andrey Alexandrovich Nikipelov, Eindhoven (NL); Johannes Antonius Gerardus Akkermans, Veldhoven (NL); Leonardus Adrianus Gerardus Grimminck, Veldhoven (NL); Erik Roelof Loopstra, Eindhoven (NL); Michael Jozef Mathijs Renkens, Sittard (NL); Adrian Toma, Veldhoven (NL); Han-Kwang Nienhuys, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 66 days.

(21) Appl. No.: 15/129,360

(22) PCT Filed: Mar. 30, 2015

(86) PCT No.: PCT/EP2015/056873
§ 371 (c)(1),
(2) Date: Sep. 26, 2016

(87) PCT Pub. No.: WO2015/150315
PCT Pub. Date: Oct. 8, 2015

(65) Prior Publication Data
US 2017/0184975 A1 Jun. 29, 2017

(30) Foreign Application Priority Data

Mar. 31, 2014 (EP) .................................... 14162828

(51) Int. Cl.
*G03F 7/20* (2006.01)
*H01S 3/09* (2006.01)
(Continued)

(52) U.S. Cl.
CPC ........... *G03F 7/70025* (2013.01); *H01F 6/04* (2013.01); *H01F 7/0273* (2013.01);
(Continued)

(58) Field of Classification Search
CPC ....... H01S 3/0903; H01S 3/0071; H05H 7/04; H05H 2007/041; H05H 2007/045; H05H 2007/046; H05H 2007/048; G03F 7/70025
See application file for complete search history.

(56) References Cited

U.S. PATENT DOCUMENTS 4,298,824 A * 11/1981 Walsh .................... H01J 25/34
315/3
4,731,598 A 3/1988 Clarke
(Continued)

FOREIGN PATENT DOCUMENTS

EP 0 066 348 12/1982
EP 0 355 741 2/1990
(Continued)

OTHER PUBLICATIONS

International Search Report and Written Opinion dated Aug. 4, 2015 in corresponding International Patent Application No. PCT/EP2015/056873.
(Continued)

*Primary Examiner* — Steven H Whitesell Gordon
(74) *Attorney, Agent, or Firm* — Pillsbury Winthrop Shaw Pittman LLP

(57) ABSTRACT

An undulator for a free electron laser includes a pipe for an electron beam and one or more periodic magnetic structures extending axially along the pipe. Each periodic magnetic structure includes a plurality of magnets and a plurality of passive ferromagnetic elements, the plurality of magnets being arranged alternately with the plurality of passive
(Continued)

ferromagnetic elements in a line extending in an axial direction. Each of the plurality of magnets is spatially separated from the pipe, and each of the passive ferromagnetic elements extends radially from an adjacent magnet towards the pipe. A spacer element may be provided between the magnets and the pipe to provide radiation shielding for the magnets and/or cooling for the pipe.

20 Claims, 12 Drawing Sheets

(51) Int. Cl.
*H05H 7/04* (2006.01)
*H01F 6/04* (2006.01)
*H01F 7/02* (2006.01)

(52) U.S. Cl.
CPC ............. *H01S 3/0903* (2013.01); *H05H 7/04* (2013.01); *H05H 2007/041* (2013.01)

(56) References Cited

U.S. PATENT DOCUMENTS

| | | | | |
|---|---|---|---|---|
| 4,876,687 | A | * | 10/1989 | Feinstein ............... H01S 3/0903 315/4 |
| 5,144,193 | A | | 9/1992 | Warren |
| 6,107,905 | A | | 8/2000 | Itoh et al. |
| 7,196,601 | B1 | * | 3/2007 | Gottschalk ............... H05H 7/04 315/5.35 |
| 2002/0044579 | A1 | * | 4/2002 | Kobayashi ............... H05H 7/04 372/37 |

FOREIGN PATENT DOCUMENTS

| | | |
|---|---|---|
| JP | H04-87628 | 3/1992 |
| JP | 2-851144 | 1/1999 |
| JP | 2001-006920 | 1/2001 |
| WO | 2014/030810 | 2/2014 |

OTHER PUBLICATIONS

Yoshiaki Tsunawaki et al., "Development of a Hybrid Helical Microwiggler With Four Poles per Period," IEEE Journal of Quantum Electronics, vol. 39, No. 2, pp. 337-342 (Feb. 2003).

P. Elleaume et al., "Design considerations for a 1 Å SASE undulator," Nuclear Instruments and Methods in Physics Research, Section A, vol. 455, No. 3, pp. 503-523 (Dec. 11, 2000).

Guiseppe Dattoli et al., "Extreme ultraviolet (EUV) sources for lithography based on synchrotron radiation," Nuclear Instruments and Methods in Physics Research, Section A, vol. 474, No. 3, pp. 259-272 (Dec. 11, 2001).

Albrecht Leuschner, "Radiation safety aspects of the TESLA test facility, phase 2," Radiation Measurements, vol. 41, pp. S252-S255 (Dec. 15, 2006).

* cited by examiner

UNDULATOR

CROSS-REFERENCE TO RELATED APPLICATIONS

This application is the U.S. national phase entry of PCT patent application no. PCT/EP2015/056873, filed Mar. 30, 2015, which claims the benefit of priority of EP Patent Application No. 14162828.9, filed Mar. 31, 2014 which is incorporated by reference herein in its entirety.

FIELD

The present invention relates to an undulator for a free electron laser. In particular, but not exclusively, the free electron laser may be used in the generation of radiation for a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

For lithography and other applications, it is desirable to be able to produce radiation beams having a known power and/or a particular spatial intensity distribution.

It is an object of the present invention to obviate or mitigate at least one problem of prior art techniques.

SUMMARY

According to a first aspect of the invention there is a provided an undulator for guiding an electron beam along a periodic path, comprising: one or more periodic magnetic structures extending axially along the undulator, each periodic magnetic structure comprising a plurality of magnets and a plurality of passive ferromagnetic elements, the plurality of magnets being arranged alternately with the plurality of passive ferromagnetic elements in a line extending in an axial direction; wherein each of the plurality of magnets is spatially separated from the periodic path followed by the electron beam, and wherein each of the passive ferromagnetic elements extends radially from an adjacent magnet towards the periodic path followed by the electron beam.

The undulator of the first aspect beneficially allows for increased longevity in comparison to known undulator designs, wherein it is conventionally understood that the magnets of an undulator should be as close as possible to the path of the electron beam. By providing additional spatial separation between the magnets and the path of the electron beam in the undulator according to the first aspect, a more stable temperature of the magnets may be achieved, stabilising the magnetic fields of the magnets. Additionally, the first aspect provides for the ability to actively shield the magnets.

The undulator may further comprise a pipe through which an electron beam can propagate. The pipe may be evacuated. The pipe may substantially surround the path followed by the electron beam. The path followed by the electron beam may extend substantially along a centre of the pipe. For embodiments comprising a pipe, each of the plurality of magnets may be spatially separated from the pipe and each of the passive ferromagnetic elements may extend radially from an adjacent magnet towards the pipe. With such an arrangement, as a result of the electron beam propagating through the pipe, the pipe may heat up due to wakefields generated by the electron beam. For embodiments comprising a pipe, a further advantage of the radial spacing of the permanent magnets from the path of the electron beam is that this provides space for a coolant system that may dissipate heat from the pipe.

The undulator may further comprise a plurality of spacer elements. One or more of the plurality of magnets may be separated from the periodic path by one of the plurality of spacer elements. The spacer elements may advantageously shield the magnets from high energy electrons and/or photons which can cause demagnetisation of the magnets.

The plurality of spacer elements may be formed from a non-magnetic material.

The plurality of spacer elements may be formed from a material with a relatively small Moliere radius and a relatively high density.

The plurality of spacer elements may be formed from tungsten or lead.

The plurality of spacer elements may be formed from an alloy comprising elements with atomic numbers in the range 29-33, 40-51 and 72-83.

The plurality of spacer elements may have a radial thickness of at least the Moliere radius of the material from which it is formed.

The plurality of spacer elements may have a radial thickness of greater than 1 cm. The plurality of spacer elements may have a radial thickness of greater than 3 cm.

The undulator may further comprise a pipe for the electron beam to pass through. Each of the one or more periodic magnetic structures may extend axially along the pipe.

Each of the plurality of magnets may be separated from the pipe by one of the plurality of spacer elements.

The plurality of magnets of a given periodic structure may be arranged such that along a length of the periodic magnetic structure the polarizations of the magnets alternate between the positive and negative axial directions.

The magnets may comprise rare earth magnets.

The magnets may be formed from an alloy of a transition metal and a rare earth element.

The alloy may be of the form of $ReTm_5$ or $Re_2Tm_{17}$, where Re is a rare earth element and Tm is transition metal. The rare earth element may comprise any of the following: samarium (Sm), praseodymium (Pr), neodymium (Nd) or dysprosium (Dy). The transition metal may comprise any of the following: cobalt (Co), iron (Fe), copper (Cu), zirconium (Zr) or hafnium (Hf). The magnets may comprise samarium-cobalt (SmCo) magnets, which are formed from an alloy of samarium and cobalt.

The alloy may further comprise boron. The alloy may be of the form of $Re_2Tm_{17}B$, where Re is a rare earth element and Tm is transition metal.

In a plane perpendicular to an axial direction, the cross section of each of the passive ferromagnetic elements may comprise a radially outer portion of that is aligned with an adjacent magnet and a radially inner portion that extends towards the periodic path.

The radially inner portion may taper inwards.

The undulator may further comprise a neutron absorbing material on an outer surface of the undulator.

The undulator may be provided with one or more cooling channels through which a coolant may be circulated.

The one or more cooling channels may be provided in the plurality of spacer elements. Alternatively, the one or more cooling channels may be provided in the pipe.

The undulator may further comprise a thermal barrier between the periodic path on the one side and the magnets and the passive ferromagnetic elements on the other side.

The thermal barrier may be provided between the spacer elements on the one side and the magnets and the passive ferromagnetic elements on the other side.

The thermal barrier may be provided between the pipe on the one side and the magnets and the passive ferromagnetic elements on the other side.

The thermal barrier may comprise a gap. The gap may be held under vacuum conditions.

The thermal barrier may comprise a low emissivity film coated on one or more surfaces of the undulator.

The ferromagnetic elements may be formed from soft iron, comprising more than 95% iron.

The ferromagnetic elements may be formed from an alloy comprising more than 20% iron and more than 20% cobalt.

The ferromagnetic elements may be formed from an alloy comprising iron, cobalt and vanadium of the form $Fe_{49}Co_{49}V_2$.

According to a second aspect of the invention there is provided an undulator for guiding an electron beam along a periodic path, comprising: one or more periodic magnetic structures extending axially along the undulator, each periodic magnetic structure comprising a plurality of magnets; and a plurality of spacer elements; wherein one or more of the plurality of magnets is spatially separated from the periodic path followed by the electron beam by one of the plurality of spacer elements.

The plurality of spacer elements may be formed from a non-magnetic material.

The plurality of spacer elements may be formed from a material with a relatively small Moliere radius and a relatively high density.

The plurality of spacer elements may have a radial thickness of at least the Moliere radius of the material from which it is formed.

The undulator may further comprise a pipe for the electron beam to pass through, each of the one or more periodic magnetic structures extending axially along the pipe.

Each of the plurality of magnets may be separated from the pipe by one of the plurality of spacer elements.

According to a third aspect of the invention there is provided an undulator module for guiding an electron beam along a periodic path, comprising: a beam pipe for an electron beam, the beam pipe defining an axis of the undulator module; a superconducting magnet assembly operable to produce a periodic magnetic field along the axis; a first coolant system operable to cool superconducting magnet assembly to a first temperature; and a second coolant system operable to cool the beam pipe to a second temperature.

A thermal barrier may be provided between the beam pipe and superconducting magnet assembly. The thermal barrier may be arranged to reduce heat transfer between the beam pipe and the superconducting magnet assembly by thermal radiation.

The thermal barrier may comprise a gap between the beam pipe and superconducting magnet assembly.

The thermal barrier may comprise multilayer insulation.

The superconducting magnet assembly may comprise one or more periodic magnetic structures. Each of the one or more periodic magnetic structures may comprise a plurality of ferromagnetic elements about which is wound a coil of superconducting wire.

The first coolant system may use liquid helium as a coolant.

The second coolant system may use liquid nitrogen as a coolant

According to a fourth aspect of the invention, there is provided a free electron laser, comprising: an electron source for producing an electron beam comprising a plurality of bunches of relativistic electrons; and an undulator according to the first, second or third aspect of the invention arranged to receive the electron beam and guide it along a periodic path so that the electron beam interacts with radiation within the undulator, stimulating emission of radiation and providing a radiation beam.

According to a fifth aspect of the invention, there is provided a lithographic system comprising: a free electron laser according to the second aspect of the invention; and at least one lithographic apparatus, each of the at least one lithographic apparatus being arranged to receive at least a portion of at least one radiation beam produced by the free electron laser.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
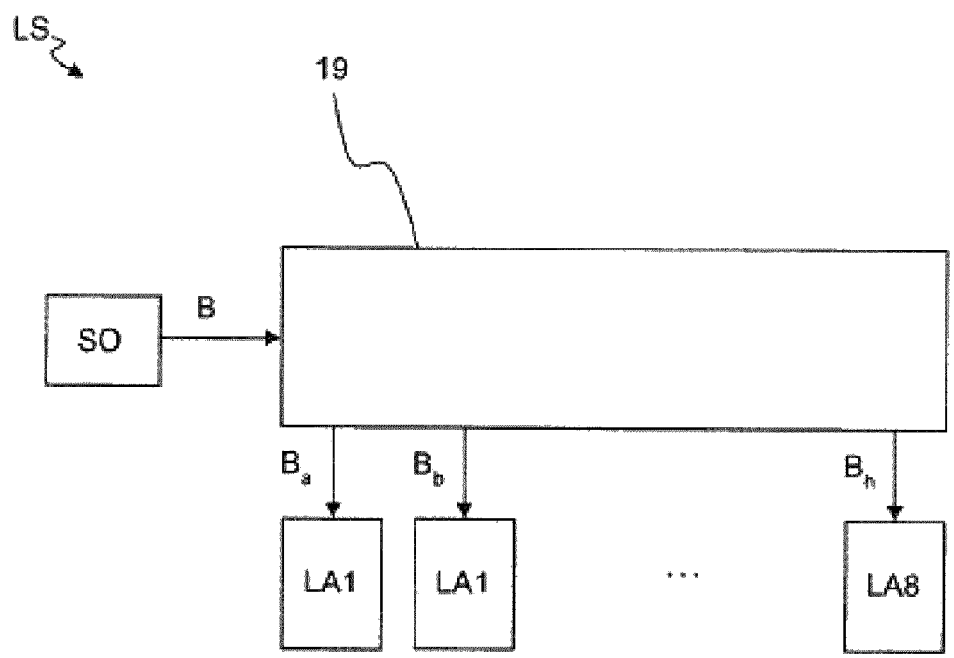
FIG. 1 is a schematic illustration of a lithographic system comprising a free electron laser according to an embodiment of the invention.

FIG. 1 shows a lithographic system LS according to one embodiment of the invention. The lithographic system LS comprises a radiation source SO, a beam splitting apparatus 19 and eight lithographic apparatuses LA1-LA8. The radiation source SO is configured to generate an extreme ultra-violet (EUV) radiation beam B (which may be referred to as a main beam). The main radiation beam B is split into a plurality of radiation beams $B_a$-$B_h$ (which may be referred to as branch beams), each of which is directed to a different one of the lithographic apparatuses LA1-LA8, by the beam splitting apparatus 19. The branch radiation beams $B_a$-$B_h$ may be split off from the main radiation beam in series, with each branch radiation beam being split off from the main radiation beam downstream from the preceding branch radiation beam. Where this is the case the branch radiation beams may for example propagate substantially parallel to each other.

The radiation source SO, beam splitting apparatus 19 and lithographic apparatuses LA1-LA8 may all be constructed and arranged such that they can be isolated from the external environment. A vacuum may be provided in at least part of the radiation source SO, beam splitting apparatus 19 and lithographic apparatuses LA1-LA8 so as to minimise the absorption of EUV radiation. Different parts of the lithographic system LS may be provided with vacuums at different pressures (i.e. held at different pressures which are below atmospheric pressure).

Figure 2:
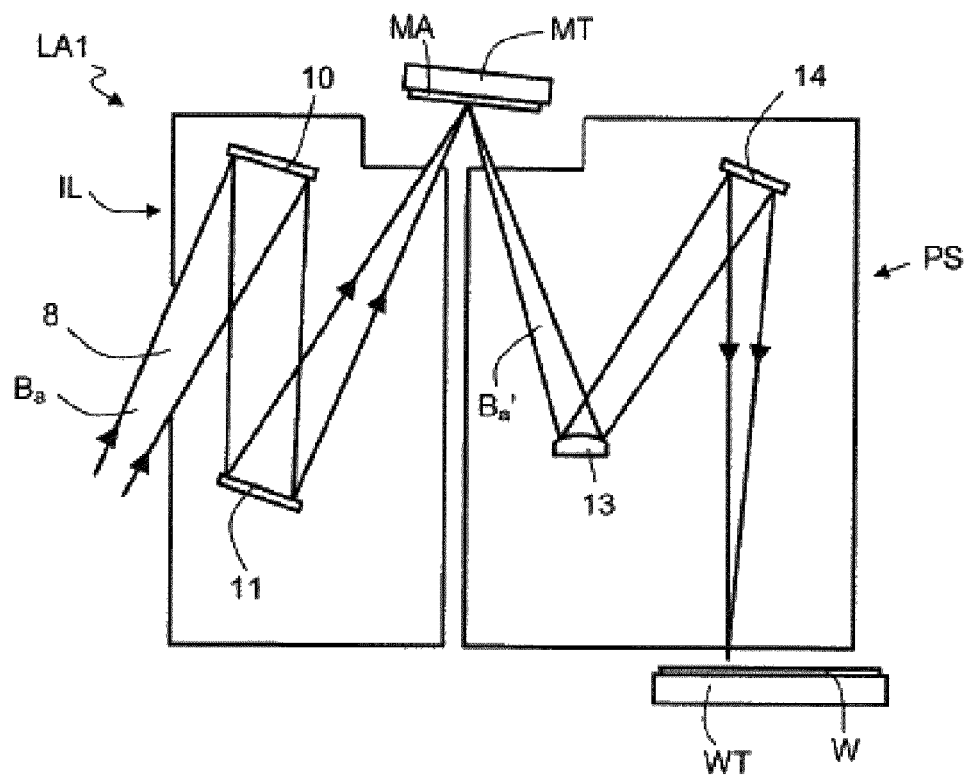
FIG. 2 is a schematic illustration of a lithographic apparatus that forms part of the lithographic system of FIG. 1.

Referring to FIG. 2, a lithographic apparatus LA1 comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus LA1 before it is incident upon the patterning device MA. The projection system PS is configured to project the radiation beam $B_a'$ (now patterned by the mask MA) onto the substrate W. The substrate W may include previously formed patterns. Where this is the case, the lithographic apparatus aligns the patterned radiation beam $B_a'$ with a pattern previously formed on the substrate W.

The branch radiation beam $B_a$ that is received by the lithographic apparatus LA1 passes into the illumination system IL from the beam splitting apparatus 19 through an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be microelectromechanical systems (MEMS) devices.

Following reflection from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The radiation source SO is configured to generate an EUV radiation beam B with sufficient power to supply each of the lithographic apparatuses LA1-LA8. The radiation source comprises a free electron laser.

A free electron laser comprises an electron source and accelerator, which are operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic structure the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be preferred for exposure of a substrate W by some lithographic apparatuses.

Figure 3:
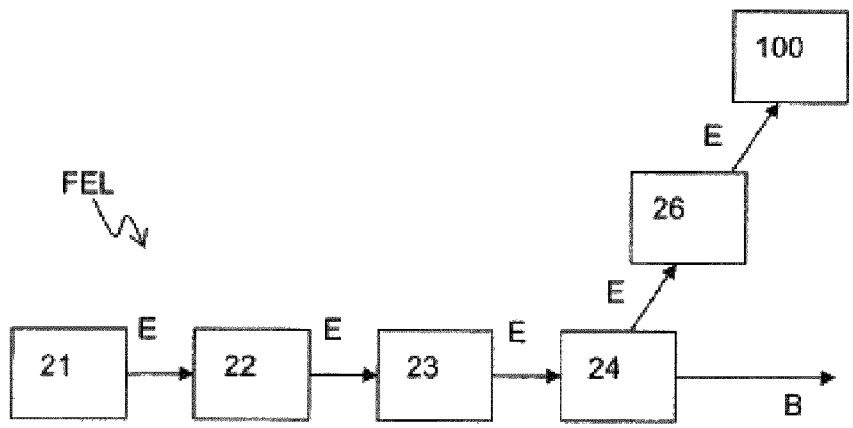
FIG. 3 is a schematic illustration of a free electron laser that forms part of the lithographic system of FIG. 1.

FIG. 3 is a schematic depiction of a free electron laser FEL comprising an injector 21, a linear accelerator 22, an undulator 24, an electron decelerator 26, a beam dump 100 and, optionally, a bunch compressor 23.

The injector 21 is arranged to produce a bunched electron beam E and comprises an electron source such as, for example, a thermionic cathode or photo-cathode and an accelerating electric field. The electron beam E is accelerated to relativistic speeds by the linear accelerator 22. In an example, the linear accelerator 22 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper. Other types of linear accelerators may also be used. For example, the linear accelerator 22 may comprise a laser accelerator, wherein the electron beam E passes through a focused laser beam and the electric field of the laser beam causes the electrons to accelerate.

The injector 21 and linear accelerator 22 together form an electron source that is operable to produce relativistic electrons.

The electron beam E passes through a bunch compressor 23, disposed between the linear accelerator 22 and the undulator 24. The bunch compressor 23 is configured to bunch electrons in the electron beam E and spatially compress existing bunches of electrons in the electron beam E.

The electron beam E then passes through the undulator 24. Generally, the undulator 24 comprises a plurality of modules. Each module comprises a periodic magnet structure, which is operable to produce a periodic magnetic field and is arranged so as to guide the relativistic electron beam E produced by the injector 21 and linear accelerator 22 along a periodic path within that module. As a result, within each undulator module, the electrons radiate electromagnetic radiation generally in the direction of a central axis of their periodic path through that module.

As electrons move through each undulator module, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 24: for a helical undulator A=1, whereas for a planar undulator A=2. In practice, each bunch of electrons will have a spread of energies although this spread may be minimised as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

A region around a central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules electron beam E should be substantially aligned with a central axis of the undulator module. A tilt or angle between the electron beam E and the central axis of the undulator module should generally not exceed 1/10ρ, where ρ is the Pierce parameter. Otherwise the conversion efficiency of the undulator module (i.e. the portion of the energy of the electron beam E which is converted to radiation in that module) may drop below a desired amount (or may drop almost to zero). In an embodiment, the Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation.

The bunched electron beam E has a finite emittance and will therefore increase in diameter unless refocused. Therefore, the undulator 24 further comprises a mechanism for refocusing the electron beam E in between one or more pairs of adjacent modules. For example, a quadrupole magnet may be provided between each pair of adjacent modules. The quadrupole magnets reduce the size of the electron bunches and keep the electron beam E within the good field region of the undulator 24. This improves the coupling between the electrons and the radiation within the next undulator module, increasing the stimulation of emission of radiation.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided through the undulator 24. The tapering may be achieved by varying the amplitude of the periodic magnetic field and/or the undulator period $\lambda_u$ within each undulator module and/or from module to module.

The interaction between the electrons and radiation within the undulator 24 produces a spread of energies within the electron bunches. The tapering of the undulator 24 may be arranged to maximise the number of electrons at or close to resonance. For example, the electron bunches may have an energy distribution which peaks at a peak energy and the tapering may be arranged to keep electrons with this peak energy at or close to resonance as they are guided through the undulator 24. Advantageously, tapering of the undulator 24 has the capacity to significantly increase conversion efficiency. For example, the use of a tapered undulator 24 may increase the conversion efficiency by a factor of more than 2. Tapering of the undulator 24 may be achieved by reducing the undulator parameter K along its length. This may be achieved by matching the undulator period $\lambda_u$ and/or the magnetic field strength $B_0$ along the axis of the undulator to the electron bunch energy to ensure that they are at or close to the resonance condition. Meeting the resonance condition in this manner increases the bandwidth of the emitted radiation.

Figure 4:
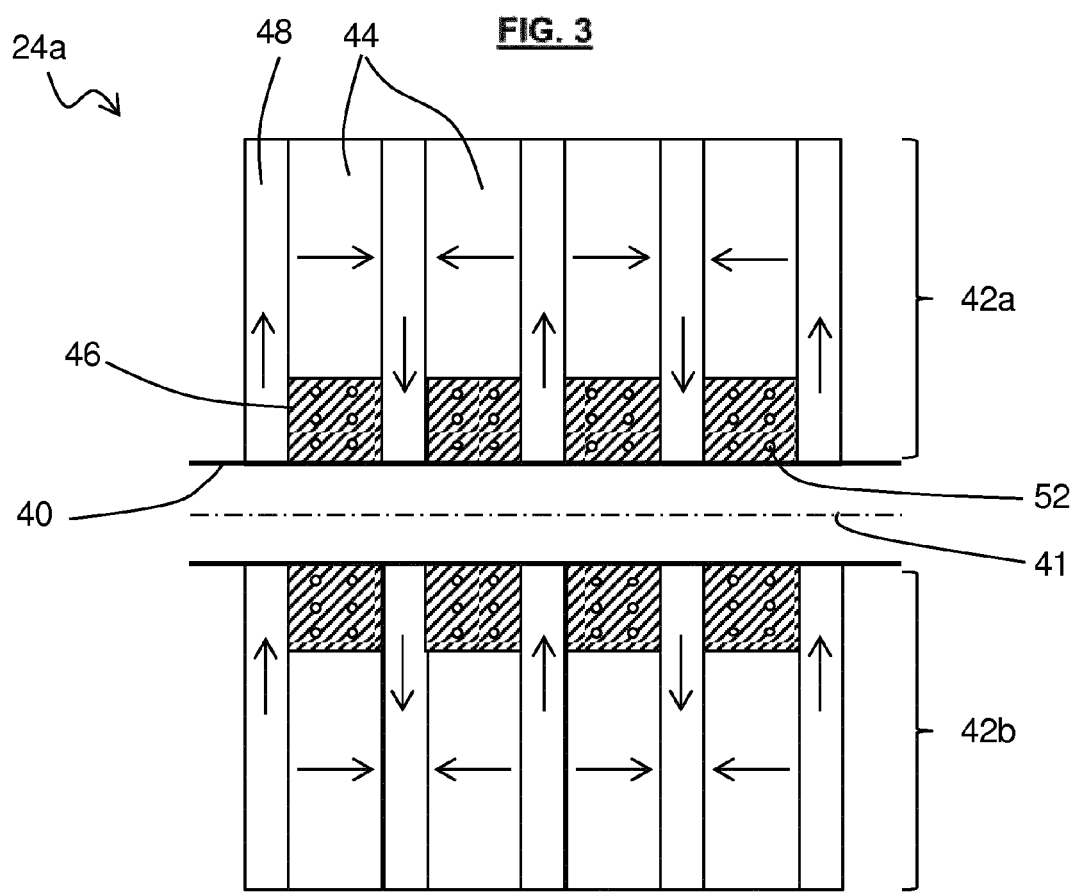
FIG. 4 is a schematic illustration of a cross sectional view of a portion of a first undulator that may form part of the free electron laser of FIG. 3 in a plane parallel to an axis of the undulator.
Figure 5:
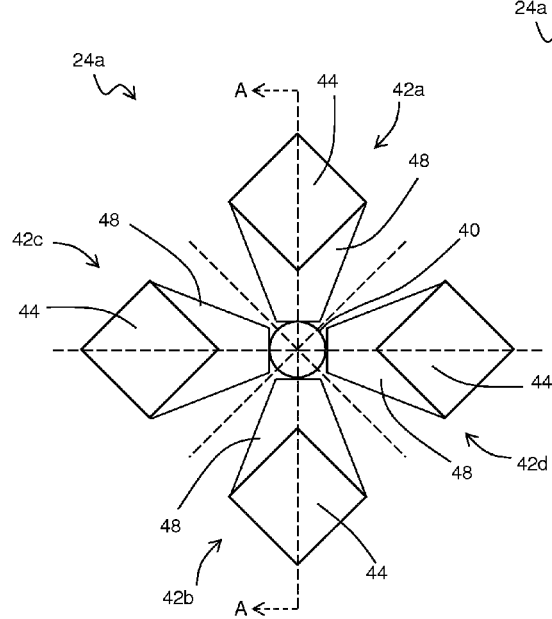
FIG. 5 is a schematic illustration of a cross sectional view of a portion of the first undulator of FIG. 4 in a plane perpendicular to an axis of the undulator.
Figure 6:
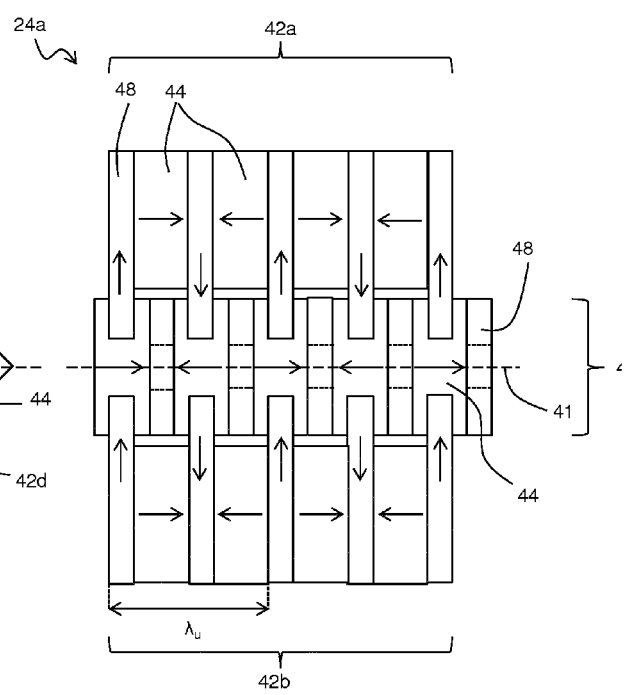
FIG. 6 is a schematic illustration of a partial cross sectional view of the portion of the first undulator of FIG. 4 in a plane parallel to an axis of the undulator, wherein a pipe of the undulator is not illustrated.

Referring to FIGS. 4, 5 and 6 different cross sectional views of a portion of a first undulator 24a according to an embodiment of the present invention are illustrated. The undulator 24a comprises a pipe 40 for the electron beam E, four periodic magnetic structures 42a-42d (FIG. 5) and a plurality of spacer elements 46. To better illustrate the features of the periodic magnetic structures 42a-42d, the spacer elements 46 have been omitted from FIGS. 5 and 6 and the beam pipe has been omitted from FIG. 6.

The pipe 40 is arranged such that, in use, the electron beam E enters one end of the pipe 40, passes through it, substantially along a central axis 41 of the undulator 24a, and exits an opposite end of the pipe 40. In use, the pipe 40 is held under vacuum conditions. As such, the pipe may be formed from a material which does not suffer from outgassing such as stainless steel. Alternatively, the pipe 40 may be formed from aluminium (Al) and may optionally be provided with a coating which does not suffer from outgassing (e.g. a coating formed from non-evaporable getters, NEGs). The pipe 40 defines a bore through which the electron beam passes, the bore being generally circular in cross section, in a plane perpendicular to the axis 41 of the undulator 24a. The pipe 40 may be generally circular in cross section, in a plane perpendicular to the axis 41 of the undulator 24a, i.e. a thickness of the pipe 40 may be generally uniform.

An interior of the pipe 40 provides a suitable environment for the electron beam E to propagate through. In particular, it is held under vacuum conditions. In an alternative embodiment, the undulator 24a does not comprise a pipe 40 but rather the electron beam propagates through a channel defined by the magnetic structures 42a-42d. In such an embodiment, the entire undulator 24a may maintain a suitable environment for the electron beam E to propagate through.

The undulator 24a is an elongate structure, extending along its axis 41, which may be referred to as an axial direction. The axis 41 of the undulator 24a runs through the center of the pipe 40. Each of the periodic structures 42a-42d is separated from the axis 41 in a direction substantially perpendicular to the axis 41 of the undulator 24a, which may be referred to as a radial direction.

All of the periodic magnetic structures 42a-42d are substantially similar in structure. In particular, each of the periodic magnetic structures 42a-42d has substantially the same undulator period, $\lambda_u$.

Each of the periodic structures 42a-42d extends axially along the pipe 40. In a plane perpendicular to the axis 41 of the undulator 24a, the four magnetic structures are distributed substantially evenly about the pipe 40. A first pair of the magnetic structures 42a, 42b are arranged substantially in phase and are arranged symmetrically, on opposite sides of the pipe 40. A second pair of magnetic structures 42c, 42d are arranged substantially in phase and are arranged symmetrically, on opposite sides of the pipe 40. The second pair of magnetic structures 42c, 42d are rotated relative to the first pair 42a, 42b about the axis 41 of the undulator 24a by 90 degrees. The first pair 42a, 42b may be shifted axially relative to the second pair 42c, 42d such that the first 42a, 42b and second 42c, 42d pairs are out of phase. The amount of the shift may determine the polarization of radiation produced by the undulator. For example, in the embodiment shown in FIGS. 5 and 6, the first pair 42a, 42b is shifted axially relative to the second pair 42c, 42d by a quarter of the undulator period $\lambda_u$. Such an arrangement may produce circularly polarized radiation as the electron beam E propagates through it.

Each of the periodic structures 42a-42d comprises a plurality of magnets 44 and a plurality of ferromagnetic elements 48.

Figure 7:
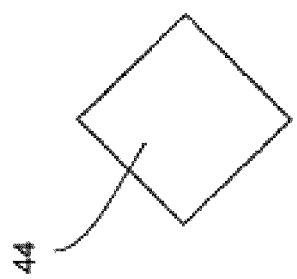
FIG. 7 is a schematic illustration of a cross sectional view of one or the magnets that forms part of the first undulator of FIG. 4 in a plane perpendicular to an axis of the undulator.

The plurality of magnets 44 of a given periodic magnetic structure 42a-42d are arranged alternately with the ferromagnetic elements 48 of that periodic magnetic structure 42a-42d in a line extending in an axial direction. Each of the plurality of magnets 44 has a substantially constant polarization direction, which is indicated in FIGS. 5 to 7 by an arrow. The polarization of each of the plurality of magnets 44 is generally in either the positive or negative axial direction. The plurality of magnets 44 of a given periodic structure are arranged such that along a length of the periodic magnetic structure 42a-42d the polarizations of the magnets 44 alternate between the positive and negative axial directions. Each periodic magnetic structure 42a-42d produces a periodic magnetic field, with the period $\lambda_u$ being the length of two magnets 44 and two ferromagnetic elements 48. Each of the magnets 44 is generally square in cross section, in a plane perpendicular to the axis 41 of the undulator 24a (see FIG. 7). Each of the magnets 44 is orientated such that, in the plane perpendicular to the axis 41 of the undulator 24a, a diagonal of the magnet 44 extends generally in a radial direction.

Each of the ferromagnetic elements 48 acts as a passive ferromagnetic element. Therefore, each of the plurality of ferromagnetic elements 48 is formed from a relatively soft ferromagnetic material. Soft ferromagnetic materials are easily magnetized and demagnetized, with a relatively small remanence, a narrow hysteresis loop (i.e. a low coercive field strength), a high magnetic permeability, and a high magnetic saturation induction. Each of the plurality of ferromagnetic elements 48 may be formed from a soft ferromagnetic material with coercive field strength less than 500 Nm and maximum relative permeability of more than 1000.

In some embodiments, the ferromagnetic elements 48 are formed from soft iron or an iron-cobalt alloy. For embodiments wherein the ferromagnetic elements 48 are formed from soft iron, the ferromagnetic elements 48 may comprise more than 95% iron. Alloys with a relatively high cobalt content (e.g. greater than 20%) may be preferred. For embodiments wherein the ferromagnetic elements 48 are formed from an iron-cobalt alloy, the ferromagnetic elements 48 may comprise more than 20% iron and more than 20% cobalt. In some embodiments the iron-cobalt alloy may comprise equal parts of iron and cobalt (this is known as Permandur). Optionally, the soft iron or an iron-cobalt alloy may comprise one or more additives at the percent level. Suitable additives include vanadium (V) or niobium (Nb). In one embodiment, the ferromagnetic elements 48 are formed from an alloy of the form $Fe_{49}Co_{49}V_2$.

Each of the plurality of magnets 44 is separated from the pipe 40 by a spacer element 46. That is, the spacer elements 46 are provided radially inside the magnets 44. Each spacer element 46 has substantially the same axial extent as its corresponding magnet 44. In cross section (in a plane perpendicular to the axis 41 of the undulator 24a) the spacer elements 46 may have any convenient shape. In the plane perpendicular to the axis 41 of the undulator 24a the spacer elements 46 may have a shape which substantially matches a radially inner portion of the ferromagnetic elements 48. In some embodiments, the shape may be a trapezoid or a tapered rectangle. Alternatively, in other embodiments the spacer elements 46 may be substantially annular in shape or may be of the form of a sector of an annulus.

Each of the plurality of magnets 44 is formed from a relatively hard ferromagnetic material, which is relatively difficult to demagnetize. Hard ferromagnetic materials are those with a relatively large remanence and a relatively broad hysteresis curve.

For example, the magnets 44 may be rare earth magnets, which are relatively strong permanent magnets. In particular, the magnets 44 may be formed from an alloy of a transition metal and a rare earth element. The alloy may be of the form of $ReTm_5$ or $Re_2Tm_{17}$, where Re is a rare earth element and Tm is transition metal. Alternatively, the magnets 44 may be formed from an alloy of a transition metal, a rare earth element and boron (B). The alloy may be of the form of $Re_2Tm_{17}B$, where Re is a rare earth element and Tm is transition metal. The rare earth element may comprise any of the following: samarium (Sm), praseodymium (Pr), neodymium (Nd) or dysprosium (Dy). The transition metal may comprise any of the following: cobalt (Co), iron (Fe), copper (Cu), zirconium (Zr) or hafnium (Hf). In one embodiment, the magnets are samarium-cobalt (SmCo) magnets, which are formed from an alloy of samarium and cobalt. These include the SmCo 1:5 series ($SmCo_5$) and the SmCo 2:17 series ($Sm_2Co_{17}$). In other embodiments, the magnets may be formed from the following alloys: $PrCo_5$, $Sm_2Fe_{17}$, $Sm_2Cu_{17}$, $Sm_2Zr_{17}$, $Sm_2Hf_{17}$. In one embodiment, the magnets 44 may be neodymium magnets (FeNdB), which are formed from an alloy of iron, neodymium and boron, and which may be of the form of $Nd_2Fe_{14}B$. In other embodiments, the magnets may be formed from $Nd_2Co_{14}B$, $Pr_2Fe_{14}B$, $Pr_2Co_{14}B$, $Dy_2Fe_{14}B$, $Dy_2Co_{14}B$.

Figure 8:
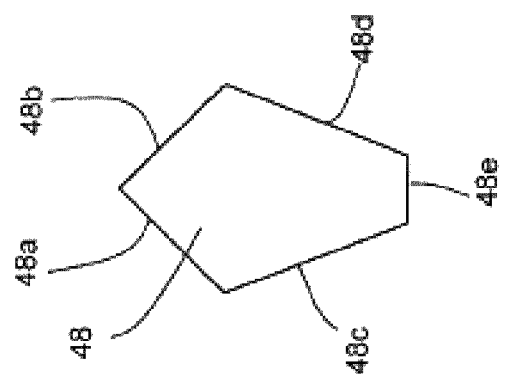
FIG. 8 is a schematic illustration of a cross sectional view of one or the ferromagnetic elements that forms part of the first undulator of FIG. 4 in a plane perpendicular to an axis of the undulator.

In cross section (in a plane perpendicular to the axis 41 of the undulator 24a) the ferromagnetic elements 48 are pentagonal in shape (see FIG. 8). In particular, the ferromagnetic elements 48 comprise first and second generally perpendicular sides 48a, 48b of substantially the same length as those of the magnets 44. The first and second sides 48a, 48b form a convex portion of the pentagon that is aligned with the magnets 44 adjacent to that ferromagnetic element 48. Each ferromagnetic element further comprises third and fourth sides 48c, 48d that extend from the magnets 44 towards the pipe 40. The third and fourth sides 48c, 48d taper inwards as they extend towards the pipe 40 and are connected by a fifth side 48e that is adjacent to the pipe 40. Each ferromagnetic element 48 therefore separates an adjacent pair of magnets 44 and extends farther towards the pipe 40 than each of the magnets 44.

The design of undulator 24a is advantageous for a number of reasons, as now described. The undulator 24a is more resistant to radiation from the beam pipe, especially high energy electrons and photons. Although the pipe 40 is maintained at high vacuum, high energy electrons from the electron beam E may be scattered by residual gas molecules within the pipe 40, for example via Rutherford scattering. Such scattered electrons may hit the magnets of an undulator, which may cause them to at least partially demagnetize.

As a high energy electron moves through matter, it will interact with the matter via the electromagnetic force, producing an electromagnetic shower or cascade of lower energy electrons and photons. This can be understood by considering the interaction of high energy electrons and photons with matter.

There are two main mechanisms for the interaction between an electron and matter: Bremsstrahlung radiation and inelastic scattering (either from atomic electrons or nuclei). For high energy electrons (with energies greater than around 10 MeV) Bremsstrahlung radiation is the dominant process. Bremsstrahlung radiation is the emission of radiation as the electron is accelerated by an electric field. For sufficiently large energies, the energy of the electron falls exponentially as a function of the depth of material it has penetrated: $E(x) \sim E_0 \exp(-x/L_{rad})$, where $E_0$ is the initial energy of the electron, x is the depth of material and $L_{rad}$ is the radiation length of that material. For low energy electrons (with energies less than around 10 MeV) inelastic scattering is the dominant process. For sufficiently low energies, rate of change of the energy of the electron with respect to the depth of material it has penetrated scales with $E^{-1/2}$.

There are four main mechanisms for the interaction between a photon and matter: (i) the photoelectric effect; (ii) Compton scattering; (iii) electron-positron pair production; and (iv) photonuclear reactions. At photon low energies, the photoelectric effect (absorption of the photon causing the emission of an electron from the matter) and Compton scattering (inelastic scattering of the photon by free electrons) are the dominant processes. There is an energy threshold for electron-positron pair production of twice the rest mass of the electron (0.511 MeV, in natural units). For high energy photons (with energies greater than around 10 MeV) electron-positron pair production is the dominant process.

The interaction between high energy electrons and photons for a given material is characterized by its radiation length, $L_{rad}$, and its Moliere radius, $R_M$. The radiation length $L_{rad}$ is a measure of the mean distance travelled by an electron before its energy is reduced by a factor of e (due to Bremsstrahlung) and 7/9 of its mean free path for electron-positron pair production. The Moliere radius $R_M$ for a given material is a measure of the transverse spread of the electromagnetic shower. The Moliere radius $R_M$ for a given material is the product of its radiation length $L_{rad}$, its density $\rho$ and the ratio of a scaling energy $E_s$ (where $E_s$=21 MeV) to its critical energy $E_c$: $R_M = L_{rad} \rho E_s/E_c$. Around 90% of the energy of an electromagnetic shower is deposited within a cylinder of radius $R_m$, around 95% of the energy of an electromagnetic shower is deposited within a cylinder of radius $2R_m$ and around 99% of the energy of an electromagnetic shower is deposited within a cylinder of radius $3.5R_m$.

If high energy electrons move through a permanent magnet, the resulting electromagnetic shower may cause the permanent magnet to heat up sufficiently to cause it to demagnetize. This is undesirable for a permanent magnet within the undulator of a free electron laser, since such demagnetization will affect the K parameter of the undulator (see equation (2) above).

Embodiments of the present invention comprise permanent magnets 44, which are spatially separated from the pipe 40, contrary to undulators known in the art, wherein the magnets are disposed as close to the pipe as possible so as to maximize the magnetic field on the axis 41. Spatial separation of the permanent magnets 44 from the pipe 40 allows a spacer element to be placed between the permanent magnets 44 and the pipe 40. The spacer material can be formed from a material that will absorb a large fraction of high energy electrons and photons that originate from the beam pipe 40. In this way, the permanent magnets 44 can be shielded from this electromagnetic radiation and the lifetime of the undulator 24a can be extended. In general, electrons which hit the wall of the beam pipe do so at a rather small grazing angle. The attenuation of such electrons in a radial direction is defined by the transverse spread of electromagnetic showers (of electrons and photons) within the spacer elements 46 and the ferromagnetic elements 48. Therefore the attenuation of high energy electrons and photons that originate from the beam pipe 40 is dependent upon the Moliere radii and radial thicknesses of the spacer elements 46 and the ferromagnetic elements 48.

The use of ferromagnetic elements 48 allows the magnets 44 to be moved away from the pipe 40 without significant loss of magnetic field strength at the axis 41 of the undulator 24a, since the ferromagnetic elements 48 are magnetized by the magnets 44 and guide the magnetic field exerted by the magnets 44 towards the axis 41. In fact, the geometry of the undulator 24a may be selected so that the ferromagnetic elements 48 provide sufficient focusing to provide a magnetic field along the axis 41 with a larger amplitude $B_0$ than in conventional undulators with the same strength of magnets. Since the ferromagnetic elements 48 are passive and are only guiding the magnetic flux produced by the magnets 44, the magnetization of the ferromagnetic elements 48 is not affected by high energy electrons or photons.

The relative (axial) thicknesses of the ferromagnetic elements 48 and the magnets 44 may have any suitable values. For a given (radial) thickness of the spacer elements 46, the axial thickness of the ferromagnetic elements 48 should be sufficiently large to ensure that the magnetic field exerted by the magnets 44 is guided towards the axis 41 such that the magnetic field on the axis 41 is within a desired amplitude range. The axial thickness and/or the shape of the ferromagnetic elements 48 should not be such that a significant amount of the magnetic flux generated by the magnets 44 leaks out of the axially facing sides of the ferromagnetic elements 48, through the spacer material and into an adjacent ferromagnetic element, thus effectively bypassing the axis 41 of the undulator 24a.

The spacer elements 46 are formed from a non-magnetic material. The spacer elements 46 are preferably formed from a material with a small Moliere radius and a relatively high density. Advantageously, the smaller the Moliere radius of the material, the smaller the (radial) thickness of the spacer elements needs to be to absorb a given amount of electromagnetic energy. The spacer elements 46 may, for example, be formed from tungsten ($R_m$=0.9 cm) or lead ($R_m$=1.5). Alternatively, the spacer elements 46 may be formed from silver or molybdenum. Alternatively, the spacer elements 46 may be formed from an alloy containing a relatively high content of elements with atomic numbers in the range 29-33, 40-51 and 72-83. A relatively high content may mean more than 50%, for example more than 60%, for example more than 70%.

The radial thickness of the spacer elements 46 is preferably at least the Moliere radius of the material from which it is formed. For electrons with small grazing incidence angles, such spacer elements 46 should absorb around 90% of their energy. More preferably, the radial thickness of the spacer elements is at least twice the Moliere radius of the material from which it is formed, which should absorb around 95% of the energy of electrons with small grazing incidence angles. More preferably, the radial thickness of the spacer elements is at least three and a half times the Moliere radius of the material from which it is formed, which should absorb around 99% of the energy of electrons with small grazing incidence angles.

In one embodiment, the spacer elements 46 are formed from tungsten and have a radial thickness of greater than 1 cm. In an alternative embodiment, the spacer elements are formed from tungsten and have a radial thickness of greater than 3 cm, more preferably greater than 6 cm. The cross-sectional shape of the spacer elements 46 in a plane perpendicular to axis 41 may be such that they occupy most of the space between beam pipe 40 and the assembly of magnets 44 and ferromagnetic elements 48. Thus, spacer elements 46 have sides 46a-46c that extend towards beam pipe 40 in a manner similar to the shape of the ferromagnetic elements 48. That is, the shape of the spacer elements 46 may substantially match that of a radially innermost portion of the ferromagnetic elements 48.

The use spacer elements 46 formed from a relatively high density material is advantageous since they can partially shield the magnets 44 from high energy electrons and photons that would otherwise cause demagnetization of the magnets 44. However, the electromagnetic showers that result from high energy electrons entering the spacer elements 46 will produce a significant number of photons. In turn, this increases the number of photonuclear reactions within the spacer elements 46, which can result in the emission of neutrons from nuclei. Therefore, in embodiments of the present invention, the magnets 44 are preferably formed from a magnetic material that is less likely to demagnetized by high energy neutrons. For this reason samarium-cobalt (SmCo) magnets are preferred to neodymium magnets (FeNdB) since the demagnetizing effect of neutrons is five orders of magnitude smaller for SmCo magnets than for FeNdB magnets.

In some embodiments, the undulator 24a may be provided with a neutron absorbing material on, for example, an outer radial surface. This may protect the magnets from neutrons produced, for example, by other parts of the free electron laser.

As a result of the pulsed electron beam propagating through the pipe 40, the pipe 40 will heat up due to wakefields generated by the electron beam E. A further advantage of the radial spacing of the permanent magnets from the pipe 40 is that this provides space for a coolant system that may dissipate heat from the pipe 40. Accordingly, the undulator 24a may be provided with cooling channels through which a coolant may be circulated. In the present embodiment, the cooling channels 52 through which a coolant may be circulated are provided in the spacer elements 46.

In some embodiments of the present invention, a small gap (not shown) may be provided between the spacer elements 46 and the pipe 40 on the one side and the magnets 44 and the ferromagnetic elements 48 on the other side. Advantageously, such a gap may at least partially thermally insulate (against conduction) the magnets 44 from the spacer elements 46 and the pipe 40. This can help to stabilize the temperature of the magnets 44 and, in turn, stabilize the magnetic field produced along the axis 41 of the undulator 24a. The gap may be held under vacuum conditions, which may improve the level of thermal insulation. This may be achieved, for example, by placing the entire undulator 24a within a chamber which can be held at low pressures. Further, one or more surfaces of the spacer elements 46, the pipe 40, the magnets 44 and the ferromagnetic elements 48 which define the gap may be coated with a low emissivity film. The low emissivity film may comprise, for example, gold, silver or nickel. Advantageously, such a low emissivity film may at least partially thermally insulate (against infrared radiation) the magnets 44 from the spacer elements 46 and the pipe 40. This may provide further stability to the temperature of the magnets 44 and, in turn, the magnetic field produced along the axis 41 of the undulator 24a.

Figure 9:
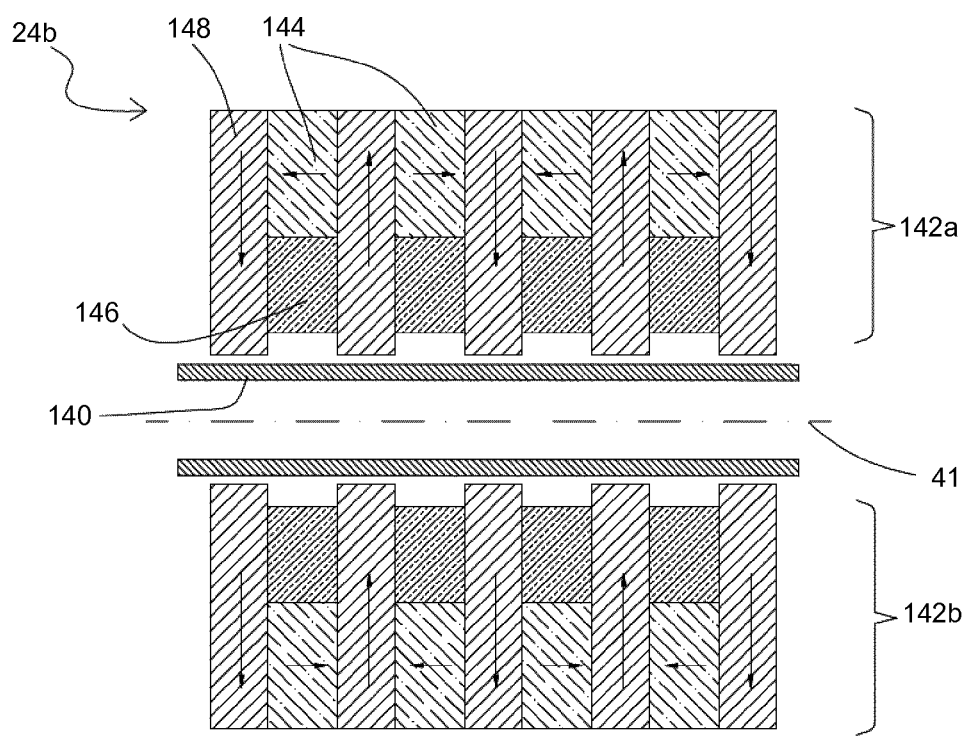
FIG. 9 is a schematic illustration of a cross sectional view of a portion of a second undulator that may form part of the free electron laser of FIG. 3 in a plane parallel to an axis of the undulator.
Figure 10:
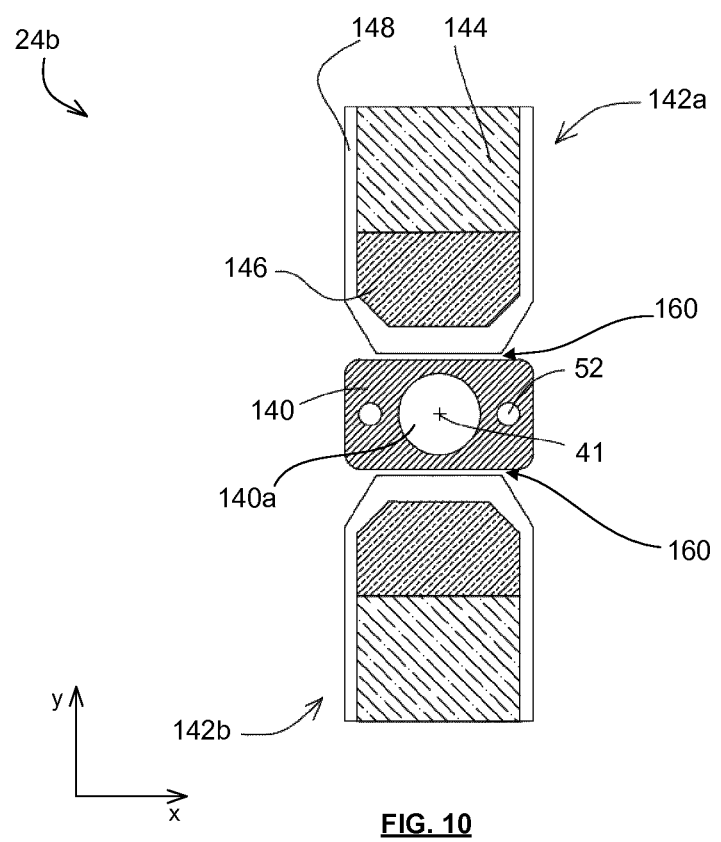
FIG. 10 is a schematic illustration of a cross sectional view of a portion of the second undulator of FIG. 9 in a plane perpendicular to an axis of the undulator.

Referring to FIGS. 9 and 10 two different cross sectional views of a portion of a second undulator 24b according to an embodiment of the present invention are illustrated. The second undulator 24b is similar in structure to the first undulator 24a and only the differences between the first and second undulators 24a, 24b will be described in detail below.

The undulator 24b comprises a pipe 140 for the electron beam E, two periodic magnetic structures 142a, 142b and a plurality of spacer elements 146. The second undulator 24b is a planar undulator (i.e. the trajectory of the electron beam E as it propagates through the second undulator 24b lies in a plane).

Pipe 140 may be formed from the same materials as pipe 40. The pipe 140 defines a bore 140a through which the electron beam passes, the bore 140a being generally circular in cross section in a plane perpendicular to the axis 41 of the undulator 24b. The pipe 140 is arranged such that, in use, the electron beam E enters one end of the pipe 140, passes through the bore 140a substantially along a central axis 41 of the undulator 24b, and exits an opposite end of the pipe 140. In use, the interior of the pipe 140 is held under vacuum conditions.

Each of the periodic magnetic structures 142a, 142b is substantially similar in structure and, in particular, has substantially the same undulator period, $\lambda_u$. Each of the periodic structures 142a, 142b comprises a plurality of magnets 144 and a plurality of ferromagnetic elements 148.

The plurality of magnets 144 of a given periodic magnetic structure 142a, 142b are arranged alternately with the ferromagnetic elements 148 of that periodic magnetic structure 142a, 142b in a line extending in an axial direction. Each of the plurality of magnets 144 has a substantially constant polarization direction, which is indicated in FIG. 9 by an arrow. The polarization of each of the plurality of magnets 144 is generally in either the positive or negative axial direction and the magnets 144 of a given periodic structure 142a, 142b are arranged such that along a length of the periodic magnetic structure 142a, 142b the polarizations of the magnets 144 alternate between the positive and negative axial directions.

Each of the magnets 144 is generally rectangular in cross section, in a plane perpendicular to the axis 41 of the undulator 24b. Note that in the plane perpendicular to the axis 41 of the undulator 24b each of the magnets 144 is orientated differently to the magnets of the first undulator 24a. In particular, the radial direction bisects the magnets 144 through two opposed faces of the magnet (as opposed to extending along a diagonal of magnet 44). Each of the plurality of magnets 144 may be substantially the same as magnets 44 and, in particular, may be formed from the same materials.

Each of the ferromagnetic elements 148 may have a different shape to ferromagnetic elements 48. In other respects, each of the ferromagnetic elements 148 may be substantially the same as ferromagnetic elements 48 and, in particular, may be formed from the same materials.

Each of the spacer elements 146 may have a different shape to spacer elements 46 (e.g. due to the different orientation of magnets 144). In cross section (in a plane perpendicular to the axis 41 of the undulator 24b) the spacer elements 146 may have any convenient shape such as, for example, a trapezoid or a tapered rectangle. In cross section (in a plane perpendicular to the axis 41 of the undulator 24b) the spacer elements 146 may have a shape which substantially matches that of a radially inner portion of the ferromagnetic elements 148. In other respects, each of the spacer elements 146 may be substantially the same as spacer elements 46 and, in particular, may be formed from the same materials.

The arrangement of the magnets 144, ferromagnetic elements 148 and spacer elements 146 of the periodic structures 142a, 142b of the second undulator 24b is generally the same as that of the magnets 44, ferromagnetic elements 48 and spacer elements 46 of the periodic structures 42a-42d of the first undulator 24a. In particular, each of the plurality of magnets 144 is separated from the pipe 140 by a spacer element 146.

Each of the periodic structures 142a, 142b extends axially along the pipe 140. In a plane perpendicular to the axis 41 of the undulator 24b, the magnetic structures 142a, 142b are arranged symmetrically, on opposite sides of the pipe 140. Each magnet 144 of periodic magnetic structure 142a is opposed to one of the magnets 144 of periodic magnetic structure 142b and each ferromagnetic element 148 of periodic magnetic structure 142a is opposed to one of the ferromagnetic elements 148 of periodic magnetic structure 142b. The polarization direction of each magnet 144 of periodic magnetic structure 142a is in an opposite direction to that of the opposite magnet 144 of periodic magnetic structure 142b. That is, the magnetic structures 142a, 142b are arranged out of phase by half of the undulator period $\lambda_u$.

In cross section (in a plane perpendicular to the axis 41 of the undulator 24b) the ferromagnetic elements 148 comprise a generally rectangular radially outer portion and a radially inner portion. The radially outer portion of each ferromagnetic element 148 is aligned with the magnets 144 adjacent to that ferromagnetic element 148. Moving in a radially inward direction, the radially inner portion tapers inwards as it extends towards the pipe 140. The radially inner portion of each ferromagnetic element 148 is aligned with the spacer elements 146 adjacent to that ferromagnetic element 146.

The design of the second undulator 24b is advantageous for the reasons given above in relation to the first undulator 24a.

As a result of the pulsed electron beam propagating through the pipe 140, the pipe 140 will heat up due to wakefields generated by the electron beam E. A further advantage of the radial spacing of the permanent magnets from the pipe 140 is that this provides space for a coolant system that may dissipate heat from the pipe 140. Accordingly, the undulator 24b may be provided with cooling channels through which a coolant may be circulated. In the present embodiment, the cooling channels 52 through which a coolant may be circulated are provided in the pipe 140.

The plane perpendicular to the axis 41 of the undulator 24b the pipe 140 may be referred to as the x-y plane (as indicated by axes in FIG. 10). A direction extending between the two magnetic structures 142a, 142b may be referred to as the y-direction and a perpendicular direction may be referred to as the x-direction. In cross section in a plane perpendicular to the axis 41 of the undulator 24b the pipe 140 is generally rectangular in shape (see FIG. 10). This rectangular shape may have rounded corners. A longer dimension of the rectangle is aligned with the x-direction and a shorter dimension of the rectangle is aligned with the y-direction. The pipe 140 is provided with two cooling channels 52. Each cooling channel 52 is provided on an opposite side of bore 140a (in the x-direction).

A small gap 160 may be provided between the pipe 140 on the one side and the magnets 144, spacer elements 146 and the ferromagnetic elements 148 on the other side. Advantageously, such a gap may at least partially thermally insulate (against conduction) the magnets 144, spacer elements 146 and the ferromagnetic elements 148 from the pipe 140. This can help to stabilize the temperature of the magnets 144 and, in turn, stabilize the magnetic field produced along the axis 41 of the undulator 24b. The gap may be held under vacuum conditions, which may improve the level of thermal insulation. This may be achieved, for example, by placing the entire undulator 24b within a chamber which can be held at low pressures. Further, one or more surfaces of the spacer elements 146, the pipe 140, the magnets 144 and the ferromagnetic elements 148 which define the gap may be coated with a low emissivity film. The low emissivity film may comprise, for example, gold, silver or nickel. Advantageously, such a low emissivity film may at least partially thermally insulate (against infrared radiation) the magnets 144 from the pipe 140. This may provide further stability to the temperature of the magnets 144 and, in turn, the magnetic field produced along the axis 41 of the undulator 24b.

Figure 11:
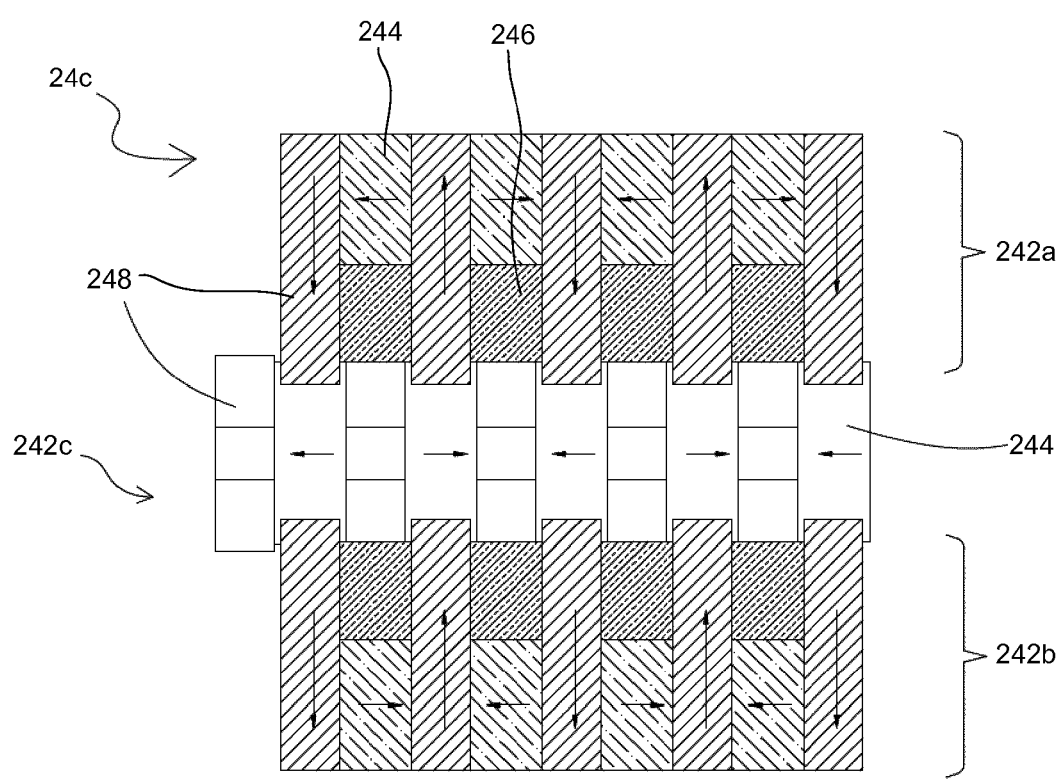
FIG. 11 is a schematic illustration of a cross sectional view of a portion of a third undulator that may form part of the free electron laser of FIG. 3 in a plane parallel to an axis of the undulator.
Figure 12:
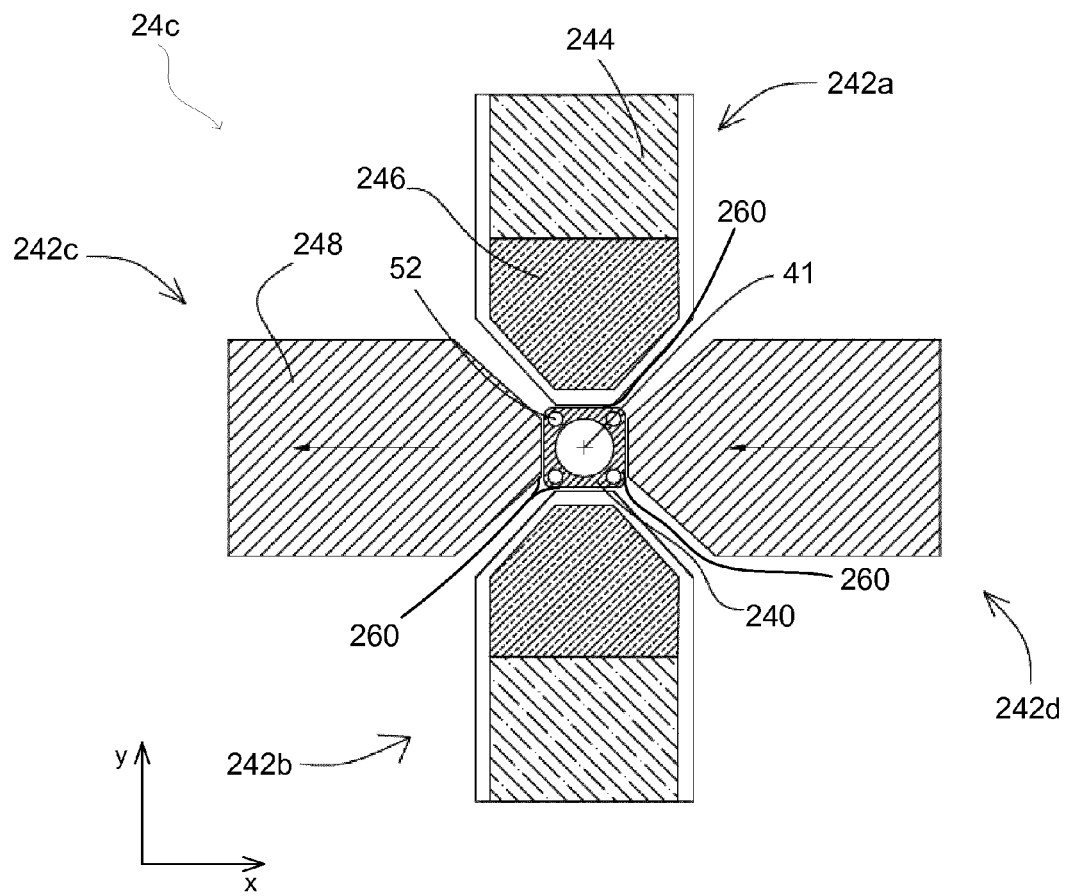
FIG. 12 is a schematic illustration of a cross sectional view of a portion of the third undulator of FIG. 11 in a plane perpendicular to an axis of the undulator.

Referring to FIGS. 11 and 12 two different cross sectional views of a portion of a third undulator 24c according to an embodiment of the present invention are illustrated. To better illustrate the features of the periodic magnetic structures, some of the spacer elements and the beam pipe has been omitted from FIG. 12.

The third undulator 24b is similar in structure to the first and second undulators 24a, 24b and only the differences between the third undulator 24c and the first and second undulators 24a, 24b will be described in detail below.

The undulator 24c comprises a pipe 240 for the electron beam E, four periodic magnetic structures 242a-242d and a plurality of spacer elements 246. Third undulator 24c is therefore similar to the second undulator 24b in most respects but, like the first undulator 24a, the third undulator 24c has four periodic magnetic structures 242a-242d.

Pipe 240 is similar to, and may be formed from the same materials as, pipe 140.

Each of the periodic magnetic structures 242a-242d is substantially similar in structure and, in particular, has substantially the same undulator period, $\lambda_u$. Each of the periodic structures 242a-242d comprises a plurality of magnets 244 and a plurality of ferromagnetic elements 248. The arrangement of the magnets 244 and ferromagnetic elements 248 within each periodic structure 242a-242d is substantially the same as that of magnets 144 and ferromagnetic elements 148 within each periodic structure 142a, 142b.

Figure 14:
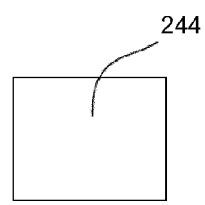
FIG. 14 is schematic illustration of a cross sectional view of one of the magnets that forms part of the third undulator of FIG. 11 in a plane perpendicular to an axis of the undulator.

As shown in FIG. 14 Each of the magnets 244 is generally rectangular in cross section, in a plane perpendicular to the axis 41 of the undulator 24c. In the plane perpendicular to the axis 41 of the undulator 24c each of the magnets 244 is orientated in a similar way to the magnets 144 of the second undulator 24b. Each of the plurality of magnets 244 may be substantially the same as magnets 44 and, in particular, may be formed from the same materials.

Each of the ferromagnetic elements 248 may have a different shape to ferromagnetic elements 48 and ferromagnetic elements 148. In other respects, each of the ferromagnetic elements 248 may be substantially the same as ferromagnetic elements 48 and ferromagnetic elements 148 and, in particular, may be formed from the same materials.

Each of the spacer elements 246 may have a different shape to spacer elements 46 and spacer elements 146. In cross section (in a plane perpendicular to the axis 41 of the undulator 24c) the spacer elements 246 may have any convenient shape such as, for example, a trapezoid or a tapered rectangle. In other respects, each of the spacer elements 246 may be substantially the same as spacer elements 46 and spacer elements 146 and, in particular, may be formed from the same materials.

The arrangement of the magnets 244, ferromagnetic elements 248 and spacer elements 246 of each of the periodic structures 242a-142d of the third undulator 24c is generally the same as that of the magnets 44, ferromagnetic elements 48 and spacer elements 46 of the periodic structures 42a-42d of the first undulator 24a and the magnets 144, ferromagnetic elements 148 and spacer elements 146 of the periodic structures 142a, 142b of the second undulator 24b. In particular, each of the plurality of magnets 244 is separated from the pipe 240 by a spacer element 246.

Each of the periodic structures 242a-242d extends axially along the pipe 240. In a plane perpendicular to the axis 41 of the undulator 24c, the four magnetic structures 142a, 142b are distributed evenly about the pipe 240. A first pair of the magnetic structures 242a, 242b are arranged symmetrically, on opposite sides of the pipe 240. Each magnet 244 of periodic magnetic structure 242a is opposed to one of the magnets 244 of periodic magnetic structure 242b and each ferromagnetic element 248 of periodic magnetic structure 242a is opposed to one of the ferromagnetic elements 248 of periodic magnetic structure 242b. The polarization direction of each magnet 244 of periodic magnetic structure 242a is in an opposite direction to that of the opposite magnet 244 of periodic magnetic structure 242b. That is, the first pair of the magnetic structures 242a, 242b are arranged out of phase by half of the undulator period $\lambda_u$.

A second pair of magnetic structures 242c, 242d are arranged out of phase by half of the undulator period $\lambda_u$ and are arranged symmetrically, on opposite sides of the pipe 240. The second pair of magnetic structures 242c, 242d is rotated relative to the first pair 242a, 242b about the central axis 41 by 90°. The first pair 242a, 242b may be shifted axially relative to the second pair 242c, 242d such that the first 242a, 242b and second 242c, 242d pairs are out of phase. The amount of the shift may determine the polarization of radiation produced by the undulator 24c. For example, in the embodiment shown in FIGS. 11 and 12, the first pair 242a, 242b is shifted axially relative to the second pair 242c, 242d by a quarter of the undulator period $\lambda_u$. That is, the magnets 244 of the first pair periodic magnetic structures 242a, 242b are disposed at substantially the same axial position as the ferromagnetic elements 248 of the second pair of magnetic structures 242c, 242d. That is, moving azimuthally around the central axis 41 of the undulator 24c each periodic magnetic structure (i.e. in the sequence 242a, 242d, 242b, 242c) is shifted axially relative to the previous periodic magnetic structure by the same amount of either $+\lambda_u/4$ or $-\lambda_u/4$. Such an arrangement may produce circularly polarized radiation as the electron beam E propagates through it and may be referred to as a helical undulator 24c. The polarization state of the circularly polarized radiation is dependent on whether each periodic magnetic structure (in the sequence 242a, 242d, 242b, 242c) is shifted axially relative to the previous periodic magnetic structure by $+\lambda_u/4$ or by $-\lambda_u/4$.

Figure 13:
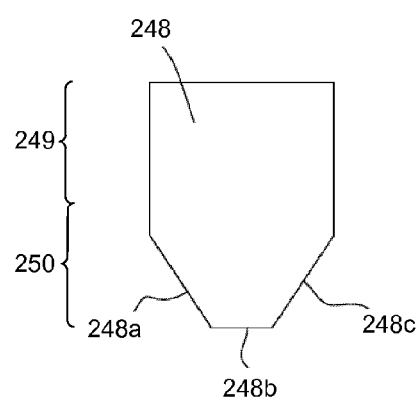
FIG. 13 is a schematic illustration of a cross sectional view of one of the ferromagnetic elements that forms part of the third undulator of FIG. 11 in a plane perpendicular to an axis of the undulator.

As shown in FIG. 13, in cross section (in a plane perpendicular to the axis 41 of the undulator 24c) the ferromagnetic elements 248 comprise a generally rectangular radially outer portion 249 and a radially inner portion 250. The radially outer portion of each ferromagnetic element 248 is aligned with the magnets 244 adjacent to that ferromagnetic element 248. The inner portion 250 is provided with two inclined sides 248a, 248c such that, moving in a radially inward direction, the radially inner portion 250 tapers inwards as it extends towards an radially innermost side 248b (which may be adjacent to the pipe 240). Note that the radially inner portion 250 of each ferromagnetic element 248 is more tapered than the radially inner portion of each ferromagnetic element 148 of the second undulator 24b such that the four periodic structures 242a-242d can be physically packed in around pipe 240.

Figure 15:
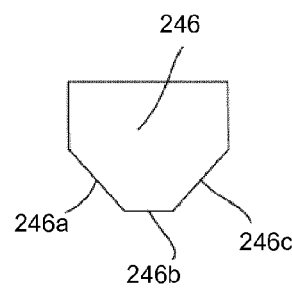
FIG. 15 is schematic illustration of a cross sectional view of one of the spacer elements that forms part of the third undulator of FIG. 11 in a plane perpendicular to an axis of the undulator.

The radially inner portion 250 of each ferromagnetic element 248 is aligned with the spacer elements 246 adjacent to that ferromagnetic element 246. As shown in FIG. 15, in cross section (in a plane perpendicular to the axis 41 of the undulator 24c) the spacer elements 246 may have a shape which substantially matches that of the radially inner portion 250 of the ferromagnetic elements 248. In particular, the spacer elements 246 are provided with two inclined sides 246a, 246c such that, moving in a radially inward direction, the spacer element 246 tapers inwards as it extends towards an radially innermost side 246b (which may be adjacent to the pipe 240).

The design of the third undulator 24c is advantageous for the reasons given above in relation to the first and second undulators 24a, 24b.

As a result of the pulsed electron beam propagating through the pipe 240, the pipe 240 will heat up due to wakefields generated by the electron beam E. A further advantage of the radial spacing of the permanent magnets from the pipe 240 is that this provides space for a coolant system that may dissipate heat from the pipe 240. Accordingly, the undulator 24c may be provided with cooling channels through which a coolant may be circulated. In the present embodiment, the cooling channels 52 through which a coolant may be circulated are provided in the pipe 240.

The plane perpendicular to the axis 41 of the undulator 24c the pipe 240 may be referred to as the x-y plane (as indicated by axes in FIG. 12). A direction extending between the first pair of magnetic structures 142a, 142b may be referred to as the y-direction and a direction extending between the second pair of magnetic structures 142c, 142d may be referred to as the x-direction. In cross section in a plane perpendicular to the axis 41 of the undulator 24c the pipe 240 is generally square in shape (see FIG. 10). This square shape may have rounded corners. One pair of sides of the square is aligned with the x-direction and another pair of sides of the square is aligned with the y-direction. The pipe 240 is provided with four cooling channels 52. Each cooling channel 52 is provided adjacent to a different one of the corners of the square shape.

A small gap 260 may be provided between the pipe 240 on the one side and the magnets 244, spacer elements 246 and the ferromagnetic elements 248 on the other side. Advantageously, such a gap may at least partially thermally insulate (against conduction) the magnets 244, spacer elements 246 and the ferromagnetic elements 248 from the pipe 240. This can help to stabilize the temperature of the magnets 144 and, in turn, stabilize the magnetic field produced along the axis 41 of the undulator 24c. The gap 260 may be held under vacuum conditions, which may improve the level of thermal insulation. This may be achieved, for example, by placing the entire undulator 24c within a chamber which can be held at low pressures. Further, one or more surfaces of the spacer elements 246, the pipe 240, the magnets 244 and the ferromagnetic elements 248 which define the gap may be coated with a low emissivity film. The low emissivity film may comprise, for example, gold, silver or nickel. Advantageously, such a low emissivity film may at least partially thermally insulate (against infrared radiation) the magnets 244 from the pipe 240. This may provide further stability to the temperature of the magnets 144 and, in turn, the magnetic field produced along the axis 41 of the undulator 24c.

Note that the ferromagnetic elements 148 of the second undulator 24b and generally of the same shape as the ferromagnetic elements 248 of the third undulator 24c (shown in FIG. 13). Further, the magnets 144 of the second undulator 24b and generally of the same shape as the magnets 244 of the third undulator 24c (shown in FIG. 14). Further, the spacer elements 146 of the second undulator 24b and generally of the same shape as the spacer elements 246 of the third undulator 24c (shown in FIG. 15).

Figure 16:
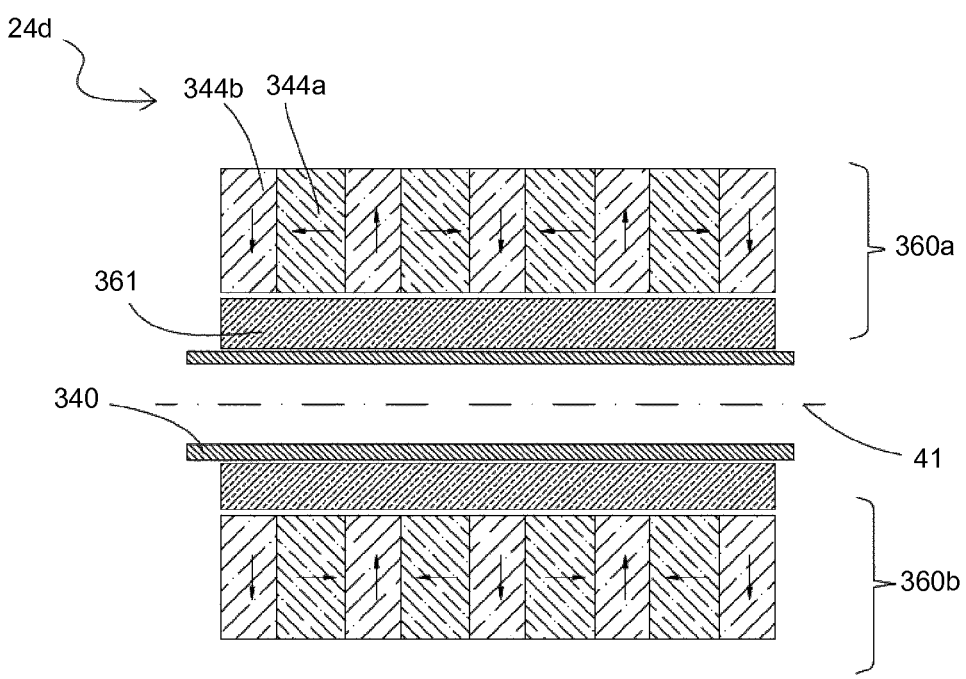
FIG. 16 is a schematic illustration of a cross sectional view of a portion of a fourth undulator that may form part of the free electron laser of FIG. 3 in a plane parallel to an axis of the undulator.

Referring to FIG. 16 a cross sectional view of a portion of a fourth undulator 24d according to an embodiment of the present invention is illustrated. The fourth undulator 24d is similar in structure to the first, second and third undulators 24a, 24b, 24c and only the differences between the fourth undulator 24d and the first, second and third undulators 24a, 24b, 24c will be described in detail below.

The undulator 24d comprises a pipe 340 for the electron beam E, a plurality of periodic magnetic structures and a spacer element 361. In the plane of FIG. 16, two periodic magnetic structures 360a, 360b are shown. Fourth undulator 24d may be a planar undulator and may comprise only these two periodic magnetic structures 360a, 360b, in a similar fashion to the second undulator 24b. Alternatively, the fourth undulator 24d may comprise an additional pair of periodic magnetic structures (not shown in FIG. 16) in a similar fashion to the first and third undulators 24a, 24c. As with the first and third undulators 24a, 24c, if the fourth undulator 24d comprises an additional pair of periodic magnetic structures (i.e. it comprises four periodic magnetic structures in total) then the fourth undulator 24d may produce radiation with linear, elliptical or circular polarization, depending on the relative axial positions of the four periodic magnetic structures.

Pipe 340 is similar to, and may be formed from the same materials as, pipe 40.

Each of the periodic magnetic structures 360a, 360b is substantially similar in structure and, in particular, has substantially the same undulator period, $\lambda_u$. Each of the periodic structures 360a, 360b comprises a plurality of magnets 344a, 344b. The fourth undulator 24d does not use passive soft ferromagnetic elements, in contrast to the first, second and third undulators 24a, 24b, 24c.

The plurality of magnets comprises first magnets 344a with a first orientation and second magnets 344b with a second orientation. Within each periodic magnetic structure 360a, 360b, the first magnets 344a are arranged alternately with the second magnets 344b in a line extending in an axial direction. Each of the plurality of magnets 344a, 344b has a substantially constant polarization direction, which is indicated in FIG. 16 by an arrow. The polarization of each of the first magnets 344a is generally in either the positive or negative axial direction. The polarization of each of the second magnets 344b is generally in either the positive or negative radial direction. Within each periodic magnetic structure 360a, 360b, the first magnets 344a are arranged alternately with the second magnets 344b in a line extending in an axial direction such that in an axial direction the direction of the polarizations of the plurality of magnets follow the sequence: negative radial, negative axial, positive radial, positive axial. Each periodic magnetic structure 360a, 360b produces a periodic magnetic field, with the period $\lambda_u$ being the length of four magnets: two first magnets 344a and two second magnets 344b.

Each of the plurality of magnets 344a, 344b may be substantially the same as magnets 44 and, in particular, may be formed from the same materials.

Spacer element 361 is of the form of a hollow cylinder which surrounds the pipe 340. That is, in cross section in a plane perpendicular to the axis 41 of the undulator 24d the spacer element 361 is annular in shape. In other respects, spacer element 361 may be substantially the same as spacer elements 46, 146, 246 and, in particular, may be formed from the same materials.

The design of the third undulator 24d is advantageous for a number of reasons. The spacer element 361 at least partially shields magnets 344a, 344b from radiation such that undulator 24d is more resistant to radiation from the beam pipe 340, especially high energy electrons and photons. It is spatial separation of the permanent magnets 344a, 344b from the pipe 340 that allows spacer element 361 to be placed between the permanent magnets 344a, 344b and the pipe 340.

As a result of the pulsed electron beam propagating through the pipe 340, the pipe 340 will heat up due to wakefields generated by the electron beam E. A further advantage of the radial spacing of the permanent magnets 344a, 344b from the pipe 340 is that this provides space for a coolant system that may dissipate heat from the pipe 340. Accordingly, the undulator 24d may be provided with cooling channels through which a coolant may be circulated. For example, cooling channels 52 through which a coolant may be circulated may be provided in the spacer elements 46 (in a manner similar to the first undulator 24a) or the pipe 340 (in a manner similar to the second or third undulators 24b, 24c).

Any one of the above described undulators 24a, 24b, 24c, 24d may be provided with an adjustment mechanism which allows the magnetic field on the axis 41 of the undulator 24a, 24b, 24c, 24d to be controlled, as now described. Four separate types of adjustment mechanisms are now described.

The first and second adjustment mechanisms use one or more plates of magnetic material to control the magnetic field on the axis 41 of the undulator 24a, 24b, 24c, 24d.

The first adjustment mechanism uses one or more plates of magnetic material. The plates may be referred to as shims. In particular, control the magnetic field on the axis 41 of the undulator 24a, 24b, 24c, 24d may be achieved by placing one or more plates of magnetic material adjacent to and radially outside of one or more of the magnets of the undulator 24a, 24b, 24c, 24d. The plates will distort the magnetic field of the undulator 24a, 24b, 24c, 24d, especially the magnetic field of the magnets they are placed next to. In turn, this will influence the magnetic field on the axis 41. The sensitivity of the magnetic field on the axis 41 to the presence of such plates may be dependent on the magnetic properties of the plates and the (radial) thickness of the plates provided next to the magnets. The sensitivity of the magnetic field on the axis 41 to the plates of magnetic material may be linearly dependent on the thicknesses of the plates. A suitable thickness of material (for affecting a desired change in the magnetic field on the axis 41) may be achieved using a one or more relatively thin individual plates. The plates may be formed from any suitable magnetic material such as, for example, an alloy of cobalt and iron (CoFe).

The first adjustment mechanism provides some control over the magnetic field on the axis 41 of the undulator 24a, 24b, 24c, 24d. However, since a desired thickness of magnetic material is achieved using one or more relatively thin plates, the resolution of such a method is limited by the (non-zero) thickness of the individual plates. Further, the first mechanism does not lend itself easily to automation. First a desired thickness of magnetic material for each magnet should be calculated so as to achieve a desired magnetic field. Then a corresponding number the individual shims should be placed next to each magnet.

The second mechanism uses one or more plates of magnetic material. The plates may be referred to as shims. In particular, the undulator 24a, 24b, 24c, 24d comprises a plate of magnetic material for one or more of the magnets. In some embodiments, each magnet is provided with a corresponding plate of magnetic material. Each plate is disposed adjacent to and radially outside of its corresponding magnet and is movable in a radial direction. To achieve this, each plate may be provided with a linear actuator. As with the first adjustment mechanism, each plate will distort the magnetic field of the undulator 24a, 24b, 24c, 24d, especially that of its corresponding magnet, to which it is adjacent. In turn, this will influence the magnetic field on the axis 41. The sensitivity of the magnetic field on the axis 41 to the presence of the plates may be dependent on: the magnetic properties of the plates; the (radial) thicknesses of the plates; and the radial position of each plate. Each of the plates may have an equal radial thickness. The influence of the plates on the magnetic field on the axis 41 as a function of the radial position of each plate may be non-linear. However, over a sufficiently small radial displacement range of the plates the dependence may be approximately linear. Control over the magnetic field on the axis 41 is achieved by independent movement of one or more of the plates in a radial direction. The plates may be formed from any suitable magnetic material such as, for example, an alloy of cobalt and iron (CoFe).

A nominal or default position of each of the plates may be radially displaced from its corresponding magnet such that the plate can be moved both radially inwards and radially outwards from said nominal position. This allows the magnetic field to be influenced by moving the plates in either (radially inwards or radially outwards) direction.

The second adjustment mechanism provides control over the magnetic field on the axis 41 of the undulator 24a, 24b, 24c, 24d. The resolution of the second adjustment mechanism is limited by the resolution in the linear radial displacement of the individual plates. The second adjustment mechanism may be expected to have a greater resolution than the first adjustment mechanism. Further, the second mechanism is suitable for automation. For example, the undulator 24a, 24b, 24c, 24d may comprise a controller which is operable to control the radial positions of each of the plates of magnetic material.

The third and fourth adjustment mechanisms use one or more actuators to move one or more parts of the undulator 24a, 24b, 24c, 24d so as to control the magnetic field on the axis 41.

The third mechanism uses one or more individually movable magnets. In particular, the undulator 24a, 24b, 24c, 24d comprises one or more actuators, each actuator being operable to control a radial position of a corresponding magnet. In one embodiment, each magnet of the undulator 24a, 24b, 24c, 24d is provided with an actuator and is therefore movable independent of the other magnets. Each actuator may be a linear actuator. Such radial movement of each individual magnet alters the distance between that magnet and the axis 41 and therefore influences the magnetic field on the axis 41.

The sensitivity of the magnetic field on the axis 41 to movement of the magnets may be dependent on the radial position of each magnet. The influence of the movement on each magnet on the magnetic field on the axis 41 as a function of the radial position of each magnet may be non-linear. However, over a sufficiently small radial displacement range of the magnets the dependence may be approximately linear. Control over the magnetic field on the axis 41 is achieved by independent movement of one or more of the magnets in a radial direction.

A nominal or default position of each of the magnets may be such that the magnet can be moved both radially inwards and radially outwards from said nominal position. This allows the magnetic field to be influenced by moving the magnets in either (radially inwards or radially outwards) direction. The sensitivity of the third mechanism may be asymmetric about the nominal position. That is, the change in the magnetic field for a given radial displacement inwards may differ from that of the same radial displacement outwards.

The third adjustment mechanism may be expected to have a good resolution. Further, the third adjustment mechanism is suitable for automation. For example, the undulator 24a, 24b, 24c, 24d may comprise a controller which is operable to control the radial positions of each of the magnets. However, there may be undesirable friction between each movable magnet and adjacent ferromagnetic elements (or magnets).

The fourth mechanism uses one or more individually movable groups of magnetic elements. In particular, the undulator 24a, 24b, 24c, 24d comprises one or more actuators, each actuator being operable to control a radial position of a corresponding group of magnetic elements. Each group of magnetic elements comprises a plurality of elements, said elements comprising magnets or ferromagnetic elements. Each group of magnetic elements may comprises a whole or a part of a periodic magnetic structure of the undulator 24a, 24b, 24c, 24d. In one embodiment, each periodic magnetic structure of the undulator 24a, 24b, 24c, 24d is provided with an actuator and is movable independent of the other periodic magnetic structures. Each actuator may be a linear actuator. Such radial movement of each individual groups of magnetic elements alters the distance between that group of magnetic elements and the axis 41 and therefore influences the magnetic field on the axis 41.

The sensitivity of the magnetic field on the axis 41 to movement of the groups of magnetic elements may be dependent on the radial position of each group of magnetic elements. The influence of the movement on each group of magnetic elements on the magnetic field on the axis 41 as a function of the radial position of each group of magnetic elements may be approximately linear. Control over the magnetic field on the axis 41 is achieved by independent movement of one or more of the groups of magnetic elements in a radial direction.

A nominal or default position of each of the groups of magnetic elements may be such that the group of magnetic elements can be moved both radially inwards and radially outwards from said nominal position. This allows the magnetic field to be influenced by moving the groups of magnetic elements in either (radially inwards or radially outwards) direction.

The fourth adjustment mechanism may be expected to have a good resolution. Further, the fourth adjustment mechanism is suitable for automation. For example, the undulator 24a, 24b, 24c, 24d may comprise a controller which is operable to control the radial positions of each of the groups of magnetic elements. However, there may be undesirable friction between adjacent pairs of groups of magnetic elements. This friction may be obviated by assembling the undulator 24a, 24b, 24c, 24d such that a gap is provided between each adjacent pair of groups of magnetic elements. This may be achieved by using shims or spacers between each adjacent pair of groups of magnetic elements, which are subsequently removed.

Any of the above described adjustment mechanisms may be used in conjunction with a mechanism for determining the magnetic field on the axis 41 of the undulator 24a, 24b, 24c, 24d. A controller may, in response to a determined magnetic field on the axis 41 of the undulator 24a, 24b, 24c, 24d, use one of the above described adjustment mechanisms to adjust the magnetic field on the axis 41 of the undulator 24a, 24b, 24c, 24d. This adjustment may be such that a desired or nominal magnetic field is achieved on the axis 41 of the undulator 24a, 24b, 24c, 24d.

In each of the above described embodiments of an undulator 24a-24d, the magnets may be provided at room temperature. This may aid the process of accurately positioning and aligning the magnets so as to accurately provide a desired magnetic field along the axis 41. Alternatively, the magnets may be provided with a coolant system and may be cooled below room temperature. Advantageously, this may provide additional resistance to radiation damage. The magnets and the pipe for the electron beam may share a common cooling system. Any suitable coolant such as, for example, liquid nitrogen may be used.

Figure 17:
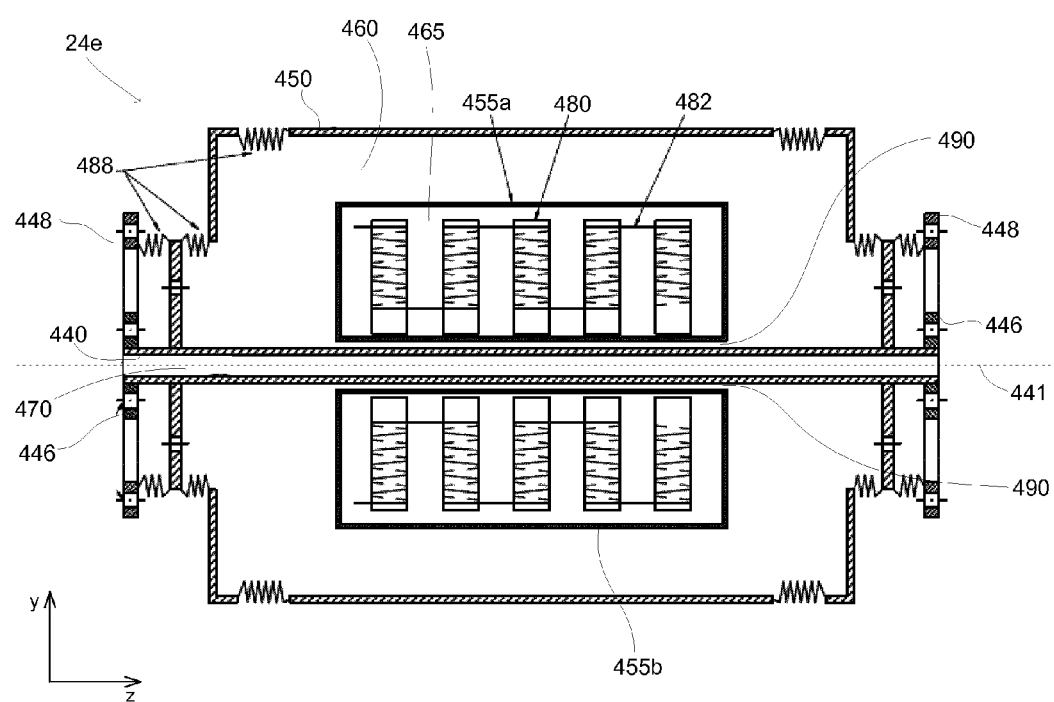
FIG. 17 is a schematic illustration of a cross sectional view of a portion of a fifth undulator that may form part of the free electron laser of FIG. 3 in a plane parallel to an axis of the undulator.
Figure 18:
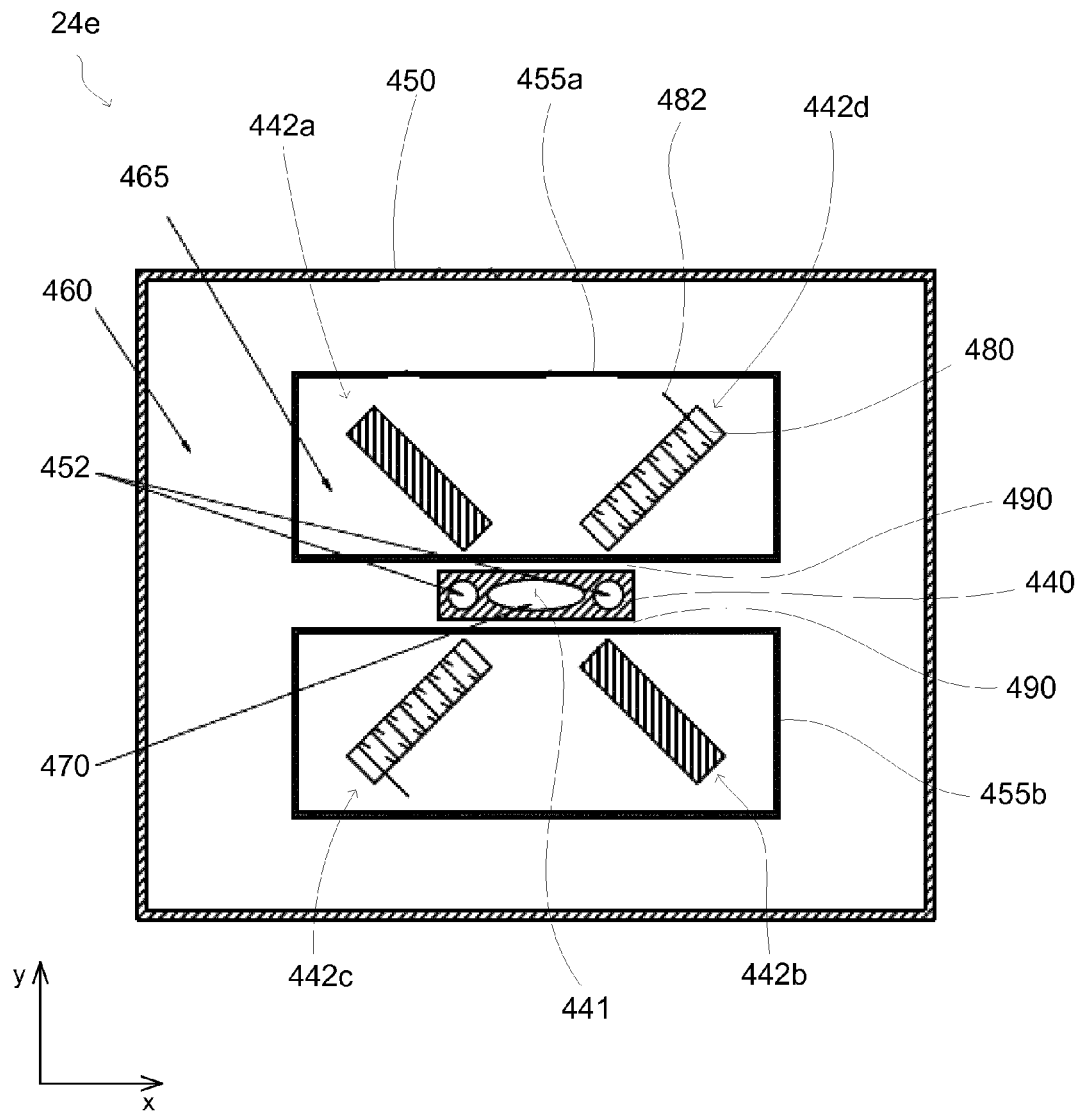
FIG. 18 is a schematic illustration of a cross sectional view of a portion of the fifth undulator of FIG. 17 in a plane parallel to an axis of the undulator.

FIGS. 17 and 18 show two different cross sectional views of an undulator module 24e, the undulator module 24e being a portion of a fifth undulator according to an embodiment of the present invention. The undulator module 24e comprises a beam pipe 440 for the electron beam E and a superconducting magnet assembly. The beam pipe 440 is suitable for an electron beam E to propagate through. The beam pipe 440 defines an axis 441 of the undulator module 24e, which extends through the centre of the beam pipe 440.

A direction along or parallel to the axis 441 may be referred to as an axial direction. In FIG. 17, the axial direction corresponds to the z-direction. A direction passing through and substantially perpendicular to the axis 441 may be referred to as a radial direction. The plane perpendicular to the axis 441 of the undulator module 24e and may be referred to as the x-y plane (as indicated by axes in FIG. 18).

In cross section in the x-y plane the beam pipe 440 is generally rectangular in shape (see FIG. 18). A longer dimension of the rectangle is aligned with the x-direction and a shorter dimension of the rectangle is aligned with the y-direction. A central bore 470 extends axially through the beam pipe 440. The central bore 470 is elliptical in cross section in the x-y plane. The beam pipe 440 is provided with two cooling channels 452 each of which extends axially through the beam pipe 440. Each cooling channel 452 is provided on an opposite side of central bore 470 (in the x-direction).

The beam pipe 440 is arranged such that, in use, the electron beam E enters one end of the pipe 440, passes through the central bore 470, substantially along the central axis 441 of the undulator 24e, and exits an opposite end of the pipe 440. In use, the central bore 470 of the beam pipe 440 is held under vacuum conditions. As such, the beam pipe 440 may be formed from a material which does not suffer from outgassing such as stainless steel. Alternatively, the beam pipe 440 may be formed from aluminium (Al) or copper (Cu) and the central bore 470 may optionally be provided with a coating which does not suffer from outgassing (e.g. a coating formed from non-evaporable getters, NEGs).

The undulator module 24e comprises an outer vessel 450, which is generally of the form of a rectangular cuboid. The beam pipe 440 extends through the outer vessel 450. The undulator 24e comprises and two inner vessels 455a, 455b. Each of the two inner vessels 455a, 455b is generally of the form of a rectangular cuboid. Each of the two inner vessels 455a, 455b is housed within, and connected to (e.g. via one or more supports), the outer vessel 450. Optionally, a mechanism for reducing transfer of vibrations between the outer vessel 450 and the inner vessels 455a, 455b (e.g. one or more bellows or dampers) may be provided. The inner vessels 455a, 455b are arranged symmetrically on opposite sides of beam pipe 440 (in the y-direction).

The beam pipe 440 is provided with a double flange connection at each end of the beam pipe 440 as now described. The double flange connection comprises two concentric generally annular flanges: a first (radially inner) flange 446 and a second (radially outer) flange 448. The first and second flanges may be connected via one or more radially extending support struts (not shown).

The first flange 446 allows the beam pipe to be coupled, for example, to a beam pipe of an adjacent undulator module or to another element of a free electron laser. The first flange 446 provides a mechanism for sealing the central bore 470 of the beam pipe 440 such that a desired environment, for example an ultra-high vacuum (UHV), may be maintained therein.

The second flange 448 allows a volume 460 between the outer vessel 250 and the two inner vessels 255a, 255b to be coupled, for example, to a corresponding volume of an adjacent undulator module. The second flange 448 provides a mechanism for sealing the volume 460 between the outer vessel 250 and the two inner vessels 255a, 255b such that a desired environment may be maintained therein.

It may be desired to maintain the position of the superconducting magnet assembly with an accuracy of around 10 μm or better to maintain a desired magnetic field on axis 441. For this reason, the beam pipe 440 is connected to the outer vessel 450 via a system of bellows 488. The system of bellows 488 reduces transfer of vibrations between the beam pipe 440 and the outer vessel 450 (for example from a flow of coolant).

The superconducting magnet assembly comprises four periodic magnetic structures 442a-442d, which are each housed within one of the two inner vessels 455a, 455b.

The four periodic magnetic structures 442a-442d are substantially similar in structure. In particular, each of the periodic magnetic structures 442a-442d has substantially the same undulator period. Each of the periodic structures 442a-442d extends axially (i.e. in the z-direction) along the pipe 440. In the x-y plane the four magnetic structures are distributed substantially evenly about the pipe 440. As with undulators 24a, 24c, the relative axial positions of the four periodic magnetic structures 442a-442d may determine the polarization of radiation produced by undulator module 24e. Moving azimuthally around the central axis 441 of the undulator module 24e each periodic magnetic structure (i.e. in the sequence 442a, 442d, 442b, 442c) is shifted axially relative to the previous periodic magnetic structure by the same amount of either $+\lambda_u/4$ or $-\lambda_u/4$. Such an arrangement may produce circularly polarized radiation as the electron beam E propagates through it and may be referred to as a helical undulator module 24e.

Each of the periodic magnetic structures 442a-442d comprises a plurality of ferromagnetic elements 480 about which is wound a coil of wire 482. The coils of wire 482 are formed from a superconducting material, i.e. a material which behaves as a superconductor at temperatures below its critical temperature. The two inner vessels 455a, 455b are provided with a first coolant system operable to cool the superconducting magnet assembly to a first temperature. The first temperature is below the critical temperature of the material from which the coils of wire are formed.

Each of the two inner vessels comprises an inlet and an outlet (not shown). The first coolant system may from a closed loop for a first coolant. The first coolant system may be operable to supply a first coolant to each inlet and extract the first coolant from each outlet. Therefore a volume 465 inside each of the two inner vessels 455a, 455b is partially filled with a first coolant.

As the coolant flows through each inner vessel 455a, 455b, it will extract heat from the periodic magnetic structures and in so doing cool them. Therefore the coolant extracted from the outlet of each inner vessel 455a, 455b will be at higher temperature than the coolant delivered to the inlet of each inner vessel 455a, 455b. The first coolant system is further operable to extract heat from the first coolant that is extracted from each outlet before supplying it to each inlet.

The first coolant may comprise liquid helium, which is a superfluid. The boiling point of helium is 4.2 K (−268.9° C.). Therefore the first temperature may be 4.2 K (−268.9° C.) or less.

The first coolant system maintains the coils of wire 482 below their critical temperature. This ensures that the coils of wire 482 have zero electrical resistance and a may support a current in the absence of an applied voltage.

The ferromagnetic elements 480 act to focus the magnetic field produced by as current flows through the coils of wire. The ferromagnetic elements 480 may be formed from iron and may be referred to as iron yokes. The ferromagnetic elements 480 may be formed from a relatively soft ferromagnetic material. Soft ferromagnetic materials are easily magnetized and demagnetized, with a relatively small remanence, a narrow hysteresis loop (i.e. a low coercive field strength), a high magnetic permeability, and a high magnetic saturation induction. For example, each of the plurality of ferromagnetic elements 480 may be formed from a soft ferromagnetic material with coercive field strength less than 500 A/m and maximum relative permeability of more than 1000. In some embodiments, the ferromagnetic elements 480 are formed from soft iron or an iron-cobalt alloy.

As the pulsed electron beam E propagates through the beam pipe 440, wakefields generated by the electron beam E will generate heat.

In use, a second coolant is circulated through cooling channels 452 in the pipe 440. This forms a second coolant system operable to cool the beam pipe 440 to a second temperature. The second temperature may be higher than the first temperature.

The cooling channels 452 may form part of a closed loop for the second coolant. As the second coolant flows through each cooling channel, it will extract heat from the beam pipe 440 and in so doing cool it. The second coolant system is operable to extract heat from the second coolant that has been extracted from the cooling channels 452, before supplying it back to the cooling channels 452.

The second coolant may comprise liquid nitrogen. The boiling point of helium is 77.4 K (−198.8° C.). Therefore the second temperature may be 77.4 K (−198.8° C.) or less. Nitrogen is particularly suitable for use as the second coolant since technology for liquefying nitrogen already exists. Further, the radio-isotopes of nitrogen that may be generated due to stray electrons from the beam pipe 440 ($^{17}$N and $^{13}$N) have lifetimes below 10 minutes. Therefore a cooling system using liquid nitrogen has an intrinsically low activity cooling down time. Carbon isotopes resulting from the decay of nitrogen isotopes can be filtered out or left in the closed system since such isotopes of carbon are also short-lived.

A thermal barrier is provided between the beam pipe 440 and superconducting magnet assembly, as now described. The thermal barrier is arranged to reduce heat transfer between the beam pipe 440 and the superconducting magnet assembly by thermal radiation.

A small gap 490 is provided between the pipe 440 and two inner vessels 455a, 455b. Advantageously, this gap 490 may at least partially thermally insulate the superconducting magnet assembly from the pipe 440. The gap 490 may be held under vacuum conditions, which may improve the level of thermal insulation. This may be achieved by maintaining the volume 460 between the outer vessel 250 and the two inner vessels 255a, 255b under vacuum conditions. Further, one or more surfaces of the beam pipe 440 of the two inner vessels 455a, 455b which define the gap 490 may be coated with a low emissivity film. The low emissivity film may comprise, for example, gold, silver or nickel. Advantageously, such a low emissivity film may reduce emission of infrared radiation from the pipe 440.

A volume 460 (including gap 490) between the outer vessel 450 and the two inner vessels 455a, 455b may be filled with an insulating material (not shown) such as, for example, multilayer insulation (MLI). The MLI may be formed from a biaxially-oriented polyethylene terephthalate (BoPET) foil such as that marketed under the brand name Mylar. The BoPET foil may be provided with an aluminium coating. Alternatively, the MLI may be formed from aluminium foil. Such an insulating material may further reduce heat transfer between the beam pipe 440 and superconducting magnet assembly.

In an embodiment, heat transfer between the beam pipe 440 and superconducting magnet assembly is <$10^{-4}$ W/(mK).

The cooling of the beam pipe 440 by the second coolant system suppresses radiative heat transfer from the beam pipe 440 to superconducting magnet assembly.

The undulator module 24e is provided with two separate cooling systems: one for the superconducting magnet assembly; and one for the beam pipe 440. This is in contrast to known superconducting undulator arrangements wherein superconducting wires are coiled round the beam pipe, which is cooled from outside by helium. One disadvantage of such prior art designs is that helium cooling is inefficient and therefore expensive. The average efficiency from the plug is 1 to 1000, i.e. 1000 Joules of electricity are required to cool away 1 Joule of energy at 4 K. With the present arrangement, only the superconducting magnet assembly is cooled using helium. The beam pipe 440 may be cooled to a temperature of around 77 K (the boiling point of nitrogen at 1 bar) or even to a temperature of around 100 K. With such an arrangement, the cooling of the wakefield heat load from beam pipe 440 is of the order of 10-100 times more energy efficient and less challenging technologically.

The electrical conductivity of metals from which the beam pipe 440 may be formed (for example aluminium or copper) increases by a factor of around 10 to 20 when the temperature is decreased from 300 K to 77 K. For example, the resistivity of aluminium is $2.7\times10^{-6}$ Ωcm at 300 K and $0.10\times10^{-6}$ Ωcm at 77 K and the resistivity of copper is $1.6\times10^{-6}$ Ωcm at 300 K and $0.16\times10^{-6}$ Ωcm at 77 K. Therefore, by cooling the beam pipe 440 to a second temperature of 77 K, the wake-field heat load on the beam pipe 440 will be reduced by a factor of around 10 to 20. For example, the wake-field heat load on the beam pipe 440 may be reduced from 100 W/m to 5 W/m. In turn, this reduces the total cooling required for the beam pipe 440. This reduction in wake-field losses from the electron beam E also results in an increase in the conversion efficiency of the free electron laser since less energy spread is introduced in the electron beam E.

The thermal conductivity of metals from which the beam pipe 440 may be formed (for example aluminium or copper) increases by a factor of around 2 when the temperature is decreased from 300 K to 77 K. For example, the thermal conductivity of aluminium is ~200 W/(Km) at 300 K and ~700 W/(Km) at 77 K and the thermal conductivity of copper is ~400 W/(Km) at 300 K and ~600 W/(Km) at 77 K. Therefore, it is easier to conduct heat away from the beam pipe 440 at lower temperatures.

Furthermore, outgassing from metals will slow down at lower temperatures. For example, outgassing of hydrogen may be reduced by a factor of around 100. Advantageously, less outgassing means less pumping is required to maintain the concentration of ions in central bore 470 (through which the electron beam E propagates) at a given level.

Although the pipe 440 is maintained at high vacuum, high energy electrons from the electron beam E may be scattered by residual gas molecules within the beam pipe 440, for example via Rutherford scattering. Such scattered electrons may hit the superconducting magnet assembly of the undulator module 24e. As such scattered electrons move through matter, they will interact with the matter via the electromagnetic force, producing an electromagnetic shower or cascade of lower energy electrons and photons.

The undulator module 24e is relatively insensitive to radiation from the beam pipe 440, especially high energy electrons and photons. Most of the energy absorbed by the superconducting magnet assembly is absorbed by the ferromagnetic elements 480. Only a relatively small fraction (e.g. of the order of 0.1%) of the energy is absorbed by the coils of wire 482 and this is typically insufficient to damage the coils of wire 482 at a significant rate.

Whilst embodiments of a radiation source SO have been described and depicted as comprising a free electron laser FEL, it should be appreciated that a radiation source may comprise any number of free electron lasers FEL. For example, a radiation source may comprise more than one free electron laser FEL.

Although the described embodiments of a lithographic system LS comprise eight lithographic apparatuses LA1-LA8, a lithographic system LS may comprise any number of lithographic apparatus. The number of lithographic apparatus which form a lithographic system LS may, for example, depend on the amount of radiation which is output from a radiation source SO and on the amount of radiation which is lost in a beam splitting apparatus 19. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise a plurality of mask inspection apparatuses to allow for some redundancy. This may allow one mask inspection apparatus to be used when another mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

It will be further appreciated that a free electron laser comprising an undulator as described above may be used as a radiation source for a number of uses, including, but not limited to, lithography.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1 GeV or more.

Embodiments of the invention have been described in the context of a free electron laser FEL which outputs an EUV radiation beam. However a free electron laser FEL may be configured to output radiation having any wavelength. Some embodiments of the invention may therefore comprise a free electron which outputs a radiation beam which is not an EUV radiation beam.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 5-10 nm such as 6.7 nm or 6.8 nm.

The lithographic apparatuses LA1 to LA8 may be used in the manufacture of ICs. Alternatively, the lithographic apparatuses LA1 to LA8 described herein may have other applications. Possible other applications include the manufacture of integrated optical systems, guidance and detection patterns for magnetic domain memories, flat-panel displays, liquid-crystal displays (LCDs), thin-film magnetic heads, etc.

In an embodiment, there is provided an undulator for guiding an electron beam along a periodic path, the undulator comprising: one or more periodic magnetic structures extending axially along the undulator, each periodic magnetic structure comprising a plurality of magnets and a plurality of passive ferromagnetic elements, the plurality of magnets being arranged alternately with the plurality of passive ferromagnetic elements in a line extending in an axial direction; wherein each of the plurality of magnets is spatially separated from the periodic path followed by the electron beam, and wherein each of the passive ferromagnetic elements extends radially from an adjacent magnet towards the periodic path followed by the electron beam.

In an embodiment, the undulator further comprises a plurality of spacer elements, wherein one or more of the plurality of magnets is separated from the periodic path by one of the plurality of spacer elements. In an embodiment, the plurality of spacer elements is formed from a non-magnetic material. In an embodiment, the plurality of spacer elements is formed from a material with a relatively small Moliere radius and a relatively high density. In an embodiment, the plurality of spacer elements is formed from tungsten or lead. In an embodiment, the plurality of spacer elements is formed from an alloy comprising elements with atomic numbers in the range 29-33, 40-51 and 72-83. In an embodiment, the plurality of spacer elements has a radial thickness of at least the Moliere radius of the material from which it is formed. In an embodiment, the plurality of spacer elements has a radial thickness of greater than 1 cm. In an embodiment, the undulator further comprises a pipe for the electron beam to pass through, each of the one or more periodic magnetic structures extending axially along the pipe. In an embodiment, each of the plurality of magnets is separated from the pipe by one of the plurality of spacer elements. In an embodiment, the plurality of magnets of a given periodic structure is arranged such that along a length of the periodic magnetic structure the polarizations of the magnets alternate between the positive and negative axial directions. In an embodiment, the magnets comprise rare earth magnets. In an embodiment, the magnets are formed from an alloy of a transition metal and a rare earth element. In an embodiment, the magnets comprise samarium-cobalt (SmCo) magnets, which are formed from an alloy of samarium and cobalt. In an embodiment, the alloy further comprises boron. In an embodiment, in a plane perpendicular to an axial direction the cross section of each of the passive ferromagnetic elements comprises a radially outer portion of that is aligned with an adjacent magnet and a radially inner portion that extends towards the periodic path. In an embodiment, the radially inner portion tapers inwards. In an embodiment, the undulator further comprises a neutron absorbing material on an outer surface of the undulator. In an embodiment, the undulator is provided with one or more cooling channels through which a coolant may be circulated. In an embodiment, the one or more cooling channels are provided in the plurality of spacer elements. In an embodiment, the one or more cooling channels are provided in the pipe. In an embodiment, the undulator further comprises a thermal barrier between the periodic path on the one side and the magnets and the passive ferromagnetic elements on the other side. In an embodiment, the thermal barrier is provided between the spacer elements on the one side and the magnets and the passive ferromagnetic elements on the other side. In an embodiment, the thermal barrier is provided between the pipe on the one side and the magnets and the passive ferromagnetic elements on the other side. In an embodiment, the thermal barrier comprises a gap. In an embodiment, the gap is held under vacuum conditions. In an embodiment, the thermal barrier comprises a low emissivity film coated on one or more surfaces of the undulator. In an embodiment, the ferromagnetic elements are formed from soft iron, comprising more than 95% iron. In an embodiment, the ferromagnetic elements are formed from an alloy comprising more than 20% iron and more than 20% cobalt. In an embodiment, the ferromagnetic elements are formed from an alloy comprising iron, cobalt and vanadium of the form $Fe_{49}Co_49V_2$.

In an embodiment, there is provided an undulator for guiding an electron beam along a periodic path, the undulator comprising: one or more periodic magnetic structures extending axially along the undulator, each periodic magnetic structure comprising a plurality of magnets; and a plurality of spacer elements; wherein one or more of the plurality of magnets is spatially separated from the periodic path followed by the electron beam by one of the plurality of spacer elements.

in an embodiment, the plurality of spacer elements are formed from a non-magnetic material. In an embodiment, the plurality of spacer elements is formed from a material with a relatively small Moliere radius and a relatively high density. In an embodiment, the plurality of spacer elements has a radial thickness of at least the Moliere radius of the material from which it is formed. In an embodiment, the undulator further comprises a pipe for the electron beam to pass through, each of the one or more periodic magnetic structures extending axially along the pipe. In an embodiment, each of the plurality of magnets is separated from the pipe by one of the plurality of spacer elements.

In an embodiment, there is provided an undulator module for guiding an electron beam along a periodic path, the undulator module comprising: a beam pipe for an electron beam, the beam pipe defining an axis of the undulator module; a superconducting magnet assembly operable to produce a periodic magnetic field along the axis; a first coolant system operable to cool superconducting magnet assembly to a first temperature; and a second coolant system operable to cool the beam pipe to a second temperature.

In an embodiment, a thermal barrier is provided between the beam pipe and superconducting magnet assembly, the thermal barrier arranged to reduce heat transfer between the beam pipe and the superconducting magnet assembly by thermal radiation. In an embodiment, the thermal barrier comprises a gap between the beam pipe and superconducting magnet assembly. In an embodiment, the thermal barrier comprises multilayer insulation. In an embodiment, the superconducting magnet assembly comprises one or more periodic magnetic structures, each comprising a plurality of ferromagnetic elements about which is wound a coil of superconducting wire. In an embodiment, the first coolant system uses liquid helium as a coolant. In an embodiment, the second coolant system uses liquid nitrogen as a coolant.

In an embodiment, there is provided a free electron laser, comprising: an electron source for producing an electron beam comprising a plurality of bunches of relativistic electrons; and an undulator as described herein arranged to receive the electron beam and guide it along a periodic path so that the electron beam interacts with radiation within the undulator, stimulating emission of radiation and providing a radiation beam.

In an embodiment, there is provided a lithographic system comprising: a free electron laser as described herein; and at least one lithographic apparatus, each of the at least one lithographic apparatus being arranged to receive at least a portion of at least one radiation beam produced by the free electron laser.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An undulator for guiding an electron beam along a periodic path, the undulator comprising:
    one or more periodic magnetic structures extending axially along the undulator, each periodic magnetic structure comprising a plurality of magnets and a plurality of passive ferromagnetic elements, the plurality of magnets being arranged alternately with the plurality of passive ferromagnetic elements in a line extending in an axial direction; and
    a plurality of spacer elements,
    wherein each of the plurality of magnets is spatially separated from the periodic path followed by the electron beam and one or more of the plurality of magnets is separated from the periodic path by one of the plurality of spacer elements,
    wherein each of the passive ferromagnetic elements extends radially from an adjacent magnet towards the periodic path followed by the electron beam, and wherein the plurality of spacer elements have a radial thickness of at least the Moliere radius of the material from which it is formed.

2. The undulator of claim 1, wherein the plurality of spacer elements are formed from a non-magnetic material.

3. The undulator of claim 2, wherein the plurality of spacer elements are formed from tungsten or lead.

4. The undulator of claim 2, wherein the plurality of spacer elements are formed from an alloy comprising elements with atomic numbers in the range 29-33, 40-51 and 72-83.

5. The undulator of claim 1, wherein the plurality of spacer elements have a radial thickness of greater than 1 cm.

6. The undulator of claim 1, further comprising a pipe for the electron beam to pass through, each of the one or more periodic magnetic structures extending axially along the pipe.

7. The undulator of claim 6, wherein each of the plurality of magnets is separated from the pipe by one of the plurality of spacer elements.

8. The undulator of claim 1, wherein the plurality of magnets of a given periodic structure are arranged such that along a length of the periodic magnetic structure the polarizations of the magnets alternate between the positive and negative axial directions.

9. The undulator of claim 1, wherein, in a plane perpendicular to an axial direction, the cross section of each of the passive ferromagnetic elements comprises a radially outer portion that is aligned with an adjacent magnet and a radially inner portion that extends towards the periodic path.

10. The undulator of claim 9, wherein the radially inner portion tapers inwards.

11. The undulator of claim 1, further comprising a neutron absorbing material on an outer surface of the undulator.

12. The undulator of claim 1, wherein the undulator is provided with one or more cooling channels through which a coolant may be circulated.

13. The undulator of claim 12, wherein the one or more cooling channels are provided in the plurality of spacer elements.

14. The undulator of claim 12, further comprising a pipe for the electron beam to pass through, each of the one or more periodic magnetic structures extending axially along the pipe, and wherein the one or more cooling channels are provided in the pipe.

15. The undulator of claim 1, further comprising a thermal barrier between the periodic path on the one side and the magnets and the passive ferromagnetic elements on the other side.

16. The undulator of claim 15, wherein the thermal barrier is provided between the spacer elements on the one side and the magnets and the passive ferromagnetic elements on the other side.

17. The undulator of claim 15, further comprising a pipe for the electron beam to pass through, each of the one or more periodic magnetic structures extending axially along the pipe, and wherein the thermal barrier is provided between the pipe on the one side and the magnets and the passive ferromagnetic elements on the other side.

18. The undulator of claim 15, wherein the thermal barrier comprises a low emissivity film coated on one or more surfaces of the undulator.

19. A free electron laser, comprising:
an electron source configured to produce an electron beam comprising a plurality of bunches of relativistic electrons; and
the undulator according to claim 1 arranged to receive the electron beam and guide it along a periodic path so that the electron beam interacts with radiation within the undulator, stimulating emission of radiation and providing a radiation beam.

20. A lithographic system comprising:
a free electron laser according to claim 19; and
at least one lithographic apparatus, each of the at least one lithographic apparatus being arranged to receive at least a portion of at least one radiation beam produced by the free electron laser.

* * * * *